United States Patent
Jung et al.

(10) Patent No.: US 10,411,702 B2
(45) Date of Patent: Sep. 10, 2019

(54) ELECTRONIC DEVICE INCLUDING INPUT APPARATUS

(71) Applicant: Samsung Electronics Co., Ltd., Gyeonggi-do (KR)

(72) Inventors: Su-Jin Jung, Gyeongsangbuk-do (KR); Yongwoo Jeon, Gyeonggi-do (KR); Jangje Park, Gyeonggi-do (KR); Sang-Pil Lee, Gyeonggi-do (KR)

(73) Assignee: Samsung Electronics Co., Ltd (KR)

( * ) Notice: Subject to any disclaimer, the term of this patent is extended or adjusted under 35 U.S.C. 154(b) by 0 days.

(21) Appl. No.: 15/213,973

(22) Filed: Jul. 19, 2016

(65) Prior Publication Data

US 2017/0033797 A1 Feb. 2, 2017

(30) Foreign Application Priority Data

Jul. 31, 2015 (KR) .......................... 10-2015-0109189

(51) Int. Cl.
| | | |
|---|---|---|
| *H03K 17/975* | (2006.01) | |
| *H03K 17/96* | (2006.01) | |
| *G06F 1/16* | (2006.01) | |
| *H05K 1/18* | (2006.01) | |
| *H05K 1/11* | (2006.01) | |
| *H04M 1/02* | (2006.01) | |

(52) U.S. Cl.
CPC ........... *H03K 17/962* (2013.01); *G06F 1/169* (2013.01); *H03K 17/9622* (2013.01);
(Continued)

(58) Field of Classification Search
CPC .................... H05K 1/115; H05K 1/189; H05K 2201/10053; H05K 5/00;
(Continued)

(56) References Cited

U.S. PATENT DOCUMENTS 5,231,386 A * 7/1993 Brandenburg ......... G05G 9/047
    200/5 R
5,982,179 A * 11/1999 Munsell ............. G01R 33/3628
    324/322
(Continued)

FOREIGN PATENT DOCUMENTS

DE   10 2010 030 315    12/2011
DE   20 2013 011 528    11/2014
(Continued)

OTHER PUBLICATIONS

International Search Report dated Nov. 8, 2016 issued in counterpart application No. PCT/KR2016/008282, 8 pages.
(Continued)

*Primary Examiner* — Anthony R Jimenez
(74) *Attorney, Agent, or Firm* — The Farrell Law Firm, P.C.

(57) ABSTRACT

An electronic device is provided. The electronic device includes a housing including a window, configured to form a $1^{st}$ side of the electronic device, and a $2^{nd}$ side of the electronic device directed in an opposite direction of the $1^{st}$ side of the electronic device, a circuit board between the $1^{st}$ side and the $2^{nd}$ side of the electronic device, and including an input circuit configured to detect an input based on a change in a capacitance, a spacer between the window and the circuit board, and having at least one space formed on one side facing the circuit board, a contact electrically connected to the input circuit by being mounted to one side of the circuit board, and contained in the at least one space, and a conductive plate coupled to the spacer, and electrically connected to the contact through the at least one space.

19 Claims, 20 Drawing Sheets

(52) U.S. Cl.
CPC .......... *H04M 1/0202* (2013.01); *H05K 1/115* (2013.01); *H05K 1/189* (2013.01); *H03K 2217/96076* (2013.01); *H03K 2217/960705* (2013.01); *H03K 2217/960755* (2013.01); *H04M 2250/22* (2013.01); *H05K 2201/10053* (2013.01)

(58) Field of Classification Search
CPC ...... H03K 2217/960705; H03K 2217/960755; H03K 2217/96076; H03K 17/962; H03K 17/955; H03K 17/96; G06F 1/169; H04M 1/0202; B32B 7/12; B32B 27/00; H04B 1/38; H01H 13/70; H04N 1/0202
USPC .............. 379/422, 369, 424, 427, 428, 370; 345/168, 169; 361/680, 679.01; 455/90, 455/550, 575; 428/411.1, 412, 174; 200/434, 5 R, 600, 5 A
See application file for complete search history.

(56) References Cited

U.S. PATENT DOCUMENTS

| | | |
|---|---|---|
| 2007/0103451 A1 | 5/2007 | Heimann et al. |
| 2008/0060925 A1 | 3/2008 | Weber et al. |
| 2008/0122661 A1 | 5/2008 | Han |
| 2009/0085889 A1 | 4/2009 | Hyeon |
| 2009/0107829 A1 | 4/2009 | Heimann |
| 2014/0140587 A1 | 5/2014 | Ballard et al. |
| 2014/0251776 A1* | 9/2014 | Kim ................... H01H 13/66 200/5 R |
| 2014/0267948 A1 | 9/2014 | Bae |
| 2016/0149571 A1 | 5/2016 | Heimann et al. |

FOREIGN PATENT DOCUMENTS

| | | |
|---|---|---|
| EP | 1 786 107 | 5/2007 |
| EP | 2 053 490 | 4/2009 |
| KR | 10-2008-0009962 | 1/2008 |
| KR | 10-2009-0032269 | 4/2009 |
| KR | 1020090111541 | 10/2009 |
| KR | 10-2014-0112704 | 9/2014 |
| WO | WO 2008/022883 | 2/2008 |

OTHER PUBLICATIONS

European Search Report dated Jun. 15, 2018 issued in counterpart application No. 16833250.0/1203, 6 pages.

European Search Report dated Sep. 28, 2018 issued in counterpart application No. 16833250.0/1203, 13 pages.

* cited by examiner

ELECTRONIC DEVICE INCLUDING INPUT APPARATUS

PRIORITY

This application claims priority under 35 U.S.C. § 119(a) of a Korean Patent Application filed on Jul. 31, 2015 in the Korean Intellectual Property Office and assigned Serial No. 10-2015-0109189, the entire content of which is incorporated herein by reference.

BACKGROUND

1. Field of the Disclosure

The present disclosure relates to an electronic device including an input device for reducing input malfunctions, and more particularly, to an electronic device including an input device that may be mounted in a narrow space of a user device, which reduces impact-related input malfunctions.

2. Description of the Related Art

With the development of the electronics communication industry in recent years, a user device (e.g., a cellular phone, an electronic organizer, a personal data assistant, a laptop computer, etc.) has become a necessity of modern life as an important means for delivering information, which changes rapidly.

In general, a user device provides various input devices for receiving a user input.

As a user device becomes thinner, there may be insufficient space to mount an input device. Further, if a user device experiences an impact, it may be difficult to maintain electrical contact between elements in the input device, which may cause input malfunctions.

SUMMARY

The present disclosure provides an electronic device that includes an input device that may be mounted in a narrow space of a user device, which reduces impact-related input malfunctions.

In accordance with an aspect of the present disclosure, an electronic device is provided. The electronic device includes a housing including a window, configured to form a $1^{st}$ side of the electronic device, and a $2^{nd}$ side of the electronic device directed in an opposite direction of the $1^{st}$ side of the electronic device, a circuit board between the $1^{st}$ side and the $2^{nd}$ side of the electronic device, and including an input circuit configured to detect an input based on a change in a capacitance, a spacer between the window and the circuit board, and having at least one space formed on one side facing the circuit board, a contact electrically connected to the input circuit by being mounted to one side of the circuit board, and contained in the at least one space, and a conductive plate coupled to the spacer, and electrically connected to the contact through the at least one space.

In accordance with another aspect of the present disclosure, an electronic device is provided. The electronic device includes a housing including a window, configured to form a $1^{st}$ side of the electronic device including a $1^{st}$ through-hole, and a $2^{nd}$ side of the electronic device directed in an opposite direction of the $1^{st}$ side of the electronic device, a circuit board between the $1^{st}$ side and the $2^{nd}$ side of the electronic device, and including an input circuit configured to detect an input based on a change in a capacitance, a spacer between the window and the circuit board including a $2^{nd}$ through-hole and at least one $3^{rd}$ through-hole placed around the $2^{nd}$ through hole, a button inserted in the $1^{st}$ through-hole and the $2^{nd}$ through-hole, wherein the button is capable of being pressed in a direction from the $1^{st}$ side of the electronic device to the $2^{nd}$ side of the electronic device, a pressing switch mounted to one side of the circuit board, between a pair of contacts, and electrified by pressing the button, a pair of conductive plates between the at least one $3^{rd}$ through-hole and the window and coupled to the spacer under the window and being separated from the circuit board, and the pair of contacts configured electrically connected to the pair of conductive plates, respectively, in an elastically transformed state through the at least one $3^{rd}$ through-hole.

DETAILED DESCRIPTION OF EMBODIMENTS OF THE PRESENT DISCLOSURE

Figure 1A:
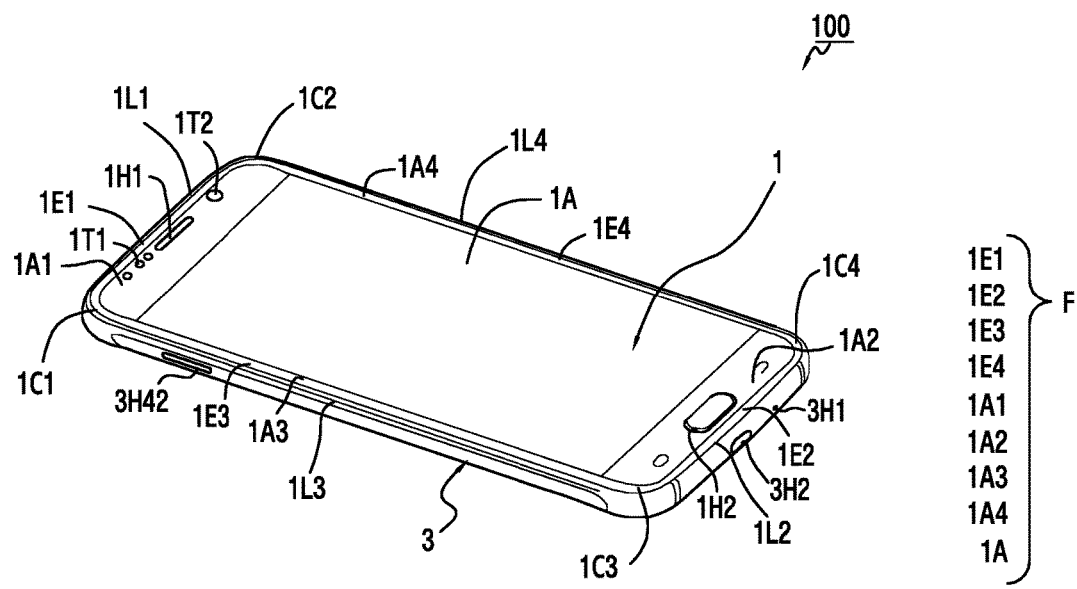
FIGS. 1A and 1B are perspective views of an electronic device according to an embodiment of the present disclosure.

Hereinafter, various embodiments of the present disclosure are described with reference to the accompanying drawings. It should be understood, however, that it is not intended to limit the present disclosure to any particular form disclosed, but, on the contrary, it is intended that the present disclosure cover all modifications, equivalents, and alternatives falling within the scope of the present disclosure as defined by the appended claims and their equivalents. Like reference numerals denote like components throughout the accompanying drawings.

The expressions "have," "may have," "include," "may include," and the like used in the present disclosure are intended to indicate a presence of a corresponding characteristic (e.g., a number, a function, an operation, or an element such as a component), and should be understood that there are additional possibilities of one or more other characteristics.

In the present disclosure, an expression "A or B," "A and/or B," "one or more of A and/or B," and the like may include all possible combinations of items enumerated together. For example, "A or B," "at least one of A and B," and "at least one of A or B," may indicate all cases where (1) at least one A is included; (2) at least one B is included; and (3) at least one A and at least one B are both included.

In the various embodiments of the present disclosure, although expressions such as "$1^{st}$", "$2^{nd}$", "first", and "second" may be used to express various elements, it is not intended to limit the corresponding elements. The above expressions may be used to distinguish one element from another element. For example, a $1^{st}$ user device and a $2^{nd}$ user device are both user devices, and indicate different user devices. For example, a $1^{st}$ element may be referred to as a $2^{nd}$ element, and similarly, the $2^{nd}$ element may be referred to as the $1^{st}$ element without departing from the scope and spirit of the present disclosure.

If a certain element (e.g., the $1^{st}$ element) is described as being "operatively or communicatively coupled with/to" or "connected to" a different element (e.g., the $2^{nd}$ element), it is to be understood that the certain element is directly coupled with/to another element or can be coupled with/to the different element via another element (e.g., a $3^{rd}$ element). In contrast, if the certain element (e.g., the $1^{st}$ element) is described as being "directly coupled with/to" or "directly connected to" the different element (e.g., the $2^{nd}$ element), it may be understood that another element (e.g., the $3^{rd}$ element) is not present between the certain element and the different element.

The expression "configured to" used in the present disclosure may be interchangeably used for, for example, "suitable for," "having the capacity to," "designed to," "adapted to," "made to," or "capable of," according to the situation. The term "configured to" may not imply only "specially designed to" in a hardware manner. Instead, in a certain situation, an expressed "a device configured to" may imply that the device is "capable of" together with other devices or components. For example, "a processor configured to perform A, B, and C" may imply a dedicated processor (e.g., an embedded processor) for performing a corresponding operation or a general purpose processor (e.g., a central processing unit (CPU) or an application processor (AP)) capable of performing corresponding operations by executing one or more software programs stored in a memory device.

Terms used in the present disclosure are for the purpose of describing certain embodiments of the present disclosure only and are not intended to limit the present disclosure. A singular expression may include a plural expression unless there is a contextually distinctive difference. Unless otherwise defined, all terms used herein have the same meanings as commonly understood by those of ordinary skill in the art to which various embodiments of the present disclosure belong. It will be further understood that terms, such as those defined in commonly used dictionaries, should be interpreted as having meanings that are consistent with their meanings in the context of the relevant art, and are not intended to be interpreted in an idealized or overly formal sense unless expressly so defined herein. Optionally, the terms defined in the present disclosure are not intended to be interpreted to exclude the embodiments of the present disclosure.

An electronic device of the present disclosure may include, for example, at least one of a smart phone, a tablet personal computer (PC), a mobile phone, a video phone, an e-book reader, a desktop PC, a laptop PC, a netbook computer, a workstation, a server, a personal digital assistant (PDA), a portable multimedia player (PMP), a moving picture experts group (MPEG)-1 audio layer 3 (MP3) player, a mobile medical device, a camera, and a wearable device. According to various embodiments of the present disclosure, a wearable device may include at least one of an accessory-type device (e.g., a watch, a ring, a bracelet, an anklet, a necklace, glasses, contact lenses, or a head-mounted device (HMD)), a fabric- or clothes-integrated device (e.g., electronic clothes), a body attaching-type device (e.g., a skin pad or tattoo), or a body implantable device (e.g., an implantable circuit).

According to certain embodiments of the present disclosure, an electronic device may be a home appliance. A home appliance may include, for example, at least one of a television (TV), a digital video disk (DVD) player, an audio player, a refrigerator, an air conditioner, a cleaner, an oven, a microwave oven, a washing machine, an air purifier, a set-top box, a home automation control panel, a security control panel, a TV box (e.g., Samsung HomeSync®, Apple TV®, or Google TV™), a game console (e.g., Xbox®, PlayStation®), an electronic dictionary, an electronic key, a camcorder, and an electronic picture frame.

According to other embodiments of the present disclosure, the electronic device may include at least one of various medical devices (e.g., various portable medical measuring devices (e.g., a blood sugar measuring device, a heart rate measuring device, a blood pressure measuring device, a body temperature measuring device, etc.), magnetic resonance angiography (MRA) device, magnetic resonance imaging (MRI) device, a computed tomography (CT) device, imaging equipment, ultrasonic instrument, etc.)), a navigation device, a global positioning system (GPS) receiver, an event data recorder (EDR), a flight data recorder (FDR), a car infotainment device, an electronic equipment for a ship (e.g., a vessel navigation device, a gyro compass, etc.), avionics, a security device, a car head unit, an industrial or domestic robot, an automated teller machines (ATMs) of financial institutions, point of sales (POS) devices of shops, and Internet of Things (IoT) (e.g., a light bulb, various sensors, an electric or gas meter, a sprinkler device, a fire alarm, a thermostat, a streetlamp, a toaster, a fitness equipment, a hot water tank, a heater, a boiler, etc.).

According to certain embodiments of the present disclosure, an electronic device may include at least one of furniture or a part of a building/constructions, an electronic board, an electronic signature input device, a projector, and various measurement machines (e.g., water supply, electricity, gas, propagation measurement machine, etc.). An electronic device according to various embodiments of the present disclosure may be one or more combinations of the aforementioned various devices. An electronic device according to certain embodiments of the present disclosure may be a flexible device. Further, an electronic device according to an embodiment of the present disclosure is not limited to the aforementioned devices, and may include a new electronic device to be developed.

Hereinafter, an electronic device according to various embodiments of the present disclosure are described below with reference to the accompanying drawings. The term "user" used in the present disclosure may refer to a person who uses an electronic device or a device which uses an electronic device (e.g., an electronic device capable of performing artificial intelligence (AI)).

Figure 1B:
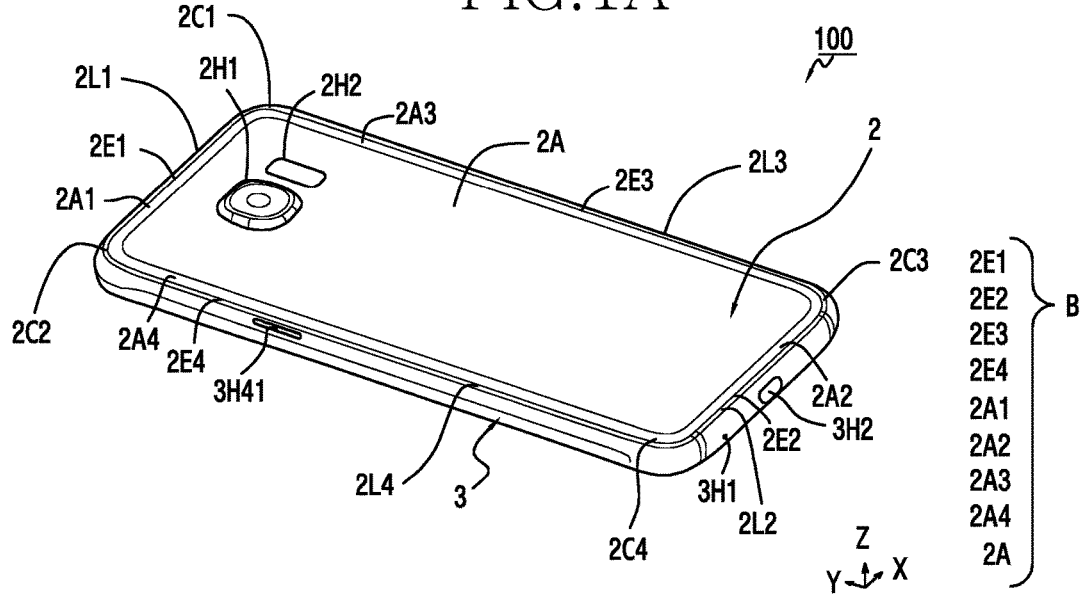

FIGS. 1A and 1B are perspective views of an electronic device according to an embodiment of the present disclosure. In addition, FIG. 2 is a perspective view of an electronic device, viewed in various directions, according to an embodiment of the present disclosure.

Figure 2:
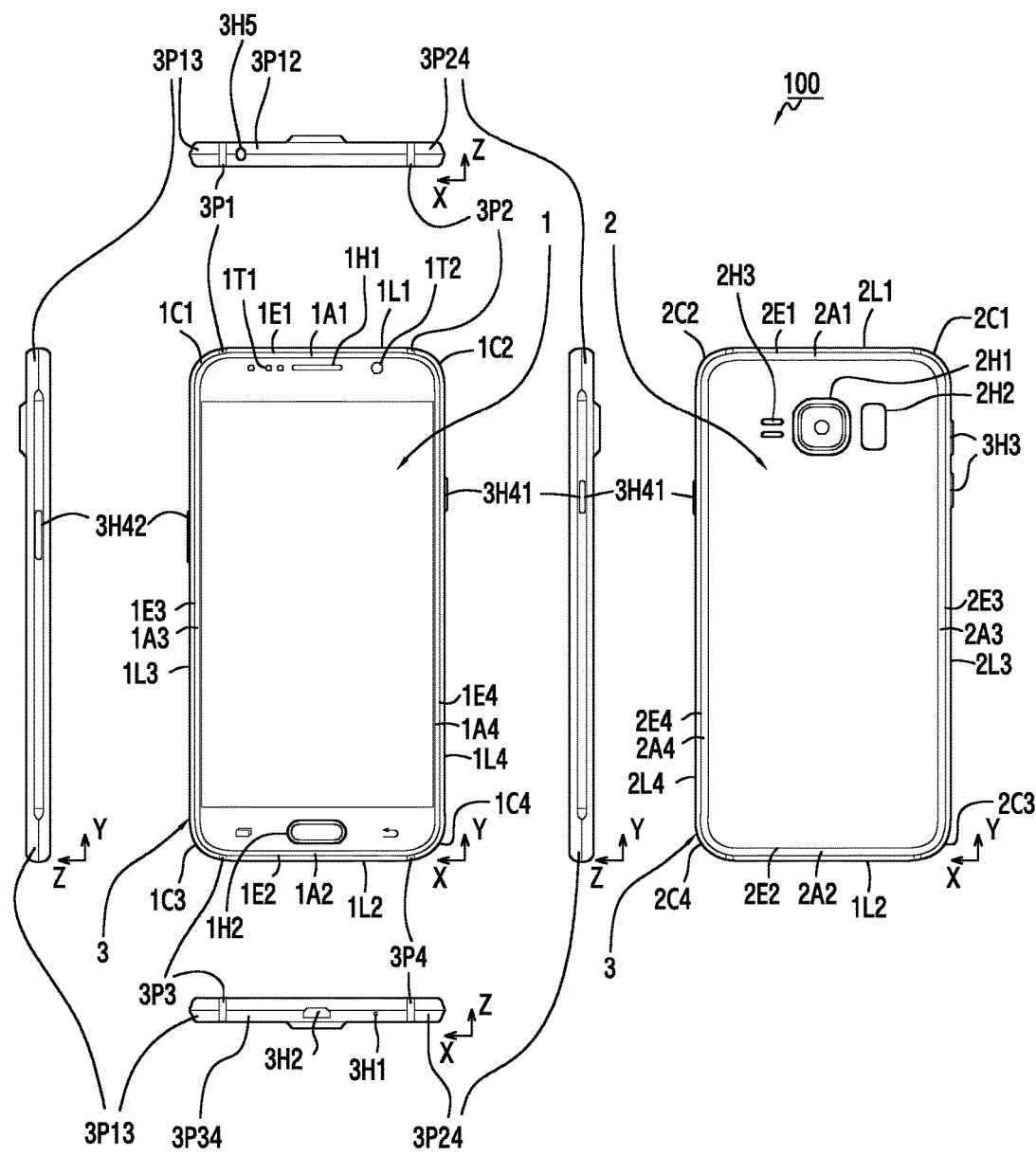
FIG. 2 is a perspective view of an electronic device, viewed in various directions, according to an embodiment of the present disclosure.

Referring to FIGS. 1A, 1B and 2, according to an embodiment of the present disclosure, an electronic device 100 has an approximately rectangular shape, and may include a front cover 1 for forming a front side (or a front surface) F of the electronic device 100 and a back cover 2 for forming a back side (or a back surface) B of the electronic device 100. Further, the electronic device 100 may include a bezel 3 which surrounds a space between the front cover 1 and the back cover 2. In addition, the electronic device 100 may include a display equipped in the space formed by the front cover 1 and the back cover 2. Herein, a screen area of the display may be visible externally through the front cover 1.

According to an embodiment of the present disclosure, the front cover 1 and/or the back cover 2 may be formed of a light transmitting material (e.g., glass, etc.).

According to an embodiment of the present disclosure, the bezel 3 may be formed of a non-metallic or metallic material.

According to an embodiment of the present disclosure, the front side F may include a $1^{st}$ edge 1E1, a $2^{nd}$ edge 1E2, a $3^{rd}$ edge 1E3, and a $4^{th}$ edge 1E4. The $1^{st}$ edge 1E1 and the $2^{nd}$ edge 1E2 may be disposed at opposite sides, and the $3^{rd}$ edge 1E3 and the $4^{th}$ edge 1E4 may be disposed at opposite sides. The $3^{rd}$ edge 1E3 may connect one end of the $1^{st}$ edge 1E1 and one end of the $2^{nd}$ edge 1E2. The $4^{th}$ edge 1E4 may connect the other end of the $1^{st}$ edge 1E1 and the other end of the $2^{nd}$ edge 1E2.

According to an embodiment of the present disclosure, the $1^{st}$ edge 1E1, the $2^{nd}$ edge 1E2, the $3^{rd}$ edge 1E3, and the $4^{th}$ edge 1E4 may each have a linear shape as illustrated, but without being limited thereto, may each have a curved shape.

According to an embodiment of the present disclosure, the front cover 1 may include a $1^{st}$ area 1A1 adjacent to the $1^{st}$ edge 1E1. The front cover 1 may include a $2^{nd}$ area 1A2 adjacent to the $2^{nd}$ edge 1E2. The $1^{st}$ area 1A1 and the $2^{nd}$ area 1A2 may be symmetric to each other.

According to an an embodiment of the present disclosure, the front cover 1 may include a $3^{rd}$ area 1A3 adjacent to the $3^{rd}$ edge 1E3. The front cover 1 may include a $4^{th}$ area 1A4 adjacent to the $4^{th}$ edge 1E4. The $3^{rd}$ area 1A3 and the $4^{th}$ area 1A4 may be symmetric to each other.

According to an embodiment of the present disclosure, at least one of the $1^{st}$ area 1A1, the $2^{nd}$ area 1A2, the $3^{rd}$ area 1A3, and the $4^{th}$ area 1A4 may include a curved surface. Alternatively, at least one of the $1^{st}$ area 1A1, the $2^{nd}$ area 1A2, the $3^{rd}$ area 1A3, and the $4^{th}$ area 1A4 may be a flat surface with a certain tilt.

According to an embodiment of the present disclosure, the front side F may include a central area 1A surrounded by the $1^{st}$ area 1A1, the $2^{nd}$ area 1A2, the $3^{rd}$ area 1A3, and the $4^{th}$ area 1A4.

According to an embodiment of the present disclosure, the central area 1A may have a rectangular or quadrangular shape as illustrated in FIG. 1A, but is not limited thereto. Further, the central area 1A may include a flat surface and/or a curved surface.

According to an embodiment of the present disclosure, the screen area of the display may overlap with the central area 1A of the front side F, and may not overlap with the $1^{st}$ area 1A1, the $2^{nd}$ area 1A2, the $3^{rd}$ area 1A3, and the $4^{th}$ area 1A4.

According to an embodiment of the present disclosure, the bezel 3 may include a neighboring $1^{st}$ corner portion 1C1 to which the $1^{st}$ edge 1E1 and the $3^{rd}$ edge 1E3 are connected. The bezel 3 may include a neighboring $2^{nd}$ corner portion 1C2 to which the $1^{st}$ edge 1E1 and the $4^{th}$ edge 1E4 are connected. Further, the bezel 3 may include a $1^{st}$ connection portion 1L1 for providing a connection between the $1^{st}$ corner portion 1C1 and the $2^{nd}$ corner portion 1C2. The $1^{st}$ corner portion 1C1 and/or the $2^{nd}$ corner portion 1C2 may protrude relatively less than the $1^{st}$ connection portion 1L1 in a direction from the back side B to the front side F. For example, from a cross-sectional view, at least one part of the $1^{st}$ corner portion 1C1 and/or the $2^{nd}$ corner portion 1C2 may not be thicker than the $1^{st}$ connection portion 1L1 in the direction from the back side B to the front side F of the electronic device 100.

According to an embodiment of the present disclosure, the bezel 3 may include a neighboring $3^{rd}$ corner portion 1C3 to which the $2^{nd}$ edge 1E3 and the $3^{rd}$ edge 1E3 are connected. The bezel 3 may include a neighboring $4^{th}$ corner portion 1C4 to which the $2^{nd}$ edge 1E2 and the $4^{th}$ edge 1E4 are connected. Further, the bezel 3 may include a $2^{nd}$ connection portion 1L2 for providing a connection between the $3^{rd}$ corner portion 1C3 and the $4^{th}$ corner portion 1C4. The $3^{rd}$ corner portion 1C3 and/or the $4^{th}$ corner portion 1C4 may protrude relatively less than the $2^{nd}$ connection portion 1L2 in the direction from the back side B to the front side F. For example, from a cross-sectional view, at least one part of the $3^{rd}$ corner connection portion 1L2 in the direction from the back side B to the front side F of the electronic device 100.

According to an embodiment of the present disclosure, the bezel 3 may include a $3^{rd}$ connection portion 1L3 for providing a connection between the $1^{st}$ corner portion 1C1 and the $3^{rd}$ corner portion 1C3. The $1^{st}$ corner portion 1C1 and/or the $3^{rd}$ corner portion 1C3 may protrude relatively less than the $3^{rd}$ connection portion 1L3 in the direction from the back side B to the front side F. For example, from a cross-sectional view, at least one part of the $1^{st}$ corner portion 1C1 and/or the $3^{rd}$ corner portion 1C3 may not be thicker than the $3^{rd}$ connection portion 1L3 in the direction from the back side B to the front side F of the electronic device 100.

According to an embodiment of the present disclosure, the bezel 3 may include a $4^{th}$ connection portion 1L4 for providing a connection between the $2^{nd}$ corner portion 1C2 and the $4^{th}$ corner portion 1C4. The $2^{nd}$ corner portion 1C2 and/or the $4^{th}$ corner portion 1C4 may protrude relatively less than the $4^{th}$ connection portion 1L4 in the direction from the back side B to the front side F. For example, from a cross-sectional view, at least one part of the $2^{nd}$ corner portion 1C2 and/or the $4^{th}$ corner portion 1C4 may not be thicker than the $4^{th}$ connection portion 1L4 in the direction from the back side B to front side F of the electronic device 100.

According to an embodiment of the present disclosure, the corner portions 1C1, 1C2, 1C3, and 1C4 may each have a round shape capable of being smoothly connected to the connection portions 1L1, 1L2, 1L3, and 1L4, respectively.

According to an embodiment of the present disclosure, the corner portions 1C1, 1C2, 1C3, and 1C4 may each protrude relatively less than the connection portions 1L1, 1L2, 1L3, and 1L4 in a direction orthogonal to the direction from the back side B to the front side F of the electronic device 100. For example, from a cross-sectional view, it may be thicker than the connection portions 1L1, 1L2, 1L3, and 1L4 in the direction orthogonal to the direction from the back side B to the front side F of the electronic device 100. For example, the protruding shape may reduce damage caused by an impact on (e.g., dropping) the electronic device 100.

According to an an embodiment of the present disclosure, the back side B may include a $1^{st}$ edge 2E1, a $2^{nd}$ edge 2E2, a $3^{rd}$ edge 2E3, and a $4^{th}$ edge 2E4. The $1^{st}$ edge 2E1 and the $2^{nd}$ edge 2E2 may be disposed at opposite sides, and the $3^{rd}$ edge 2E3 and the $4^{th}$ edge 2E4 may be disposed at opposite sides. The $3^{rd}$ edge 2E3 may connect one end of the $1^{st}$ edge 2E1 and one end of the $2^{nd}$ edge 2E3. The $4^{th}$ edge 2E4 may connect the other end of the $1^{st}$ edge 2E1 and the other end of the $2^{nd}$ edge 2E2.

According to an embodiment of the present disclosure, the $1^{st}$ edge 2E1, the $2^{nd}$ edge 2E2, the $3^{rd}$ edge 2E3, and the $4^{th}$ edge 2E4 may each have a linear shape as illustrated, but without being limited thereto, may each have a curved shape.

According to an embodiment of the present disclosure, the back cover 2 may include a $1^{st}$ area 2A1 adjacent to the $1^{st}$ edge 2E1. The back cover 2 may include a $2^{nd}$ area 2A2 adjacent to the $2^{nd}$ edge 2E2. The $1^{st}$ area 2A1 and the $2^{nd}$ area 2A2 may be symmetric to each other.

According to an embodiment of the present disclosure, the back cover 2 may include a $3^{rd}$ area 2A3 adjacent to the $3^{rd}$ edge 2E3. The back cover 2 may include a $4^{th}$ area 2A4 adjacent to the $4^{th}$ edge 2E4. The $3^{rd}$ area 2A3 and the $4^{th}$ area 2A4 may be symmetric to each other.

According to an embodiment of the present disclosure, at least one of the $1^{st}$ area 2A1, the $2^{nd}$ area 2A2, the $3^{rd}$ area 2A3, and the $4^{th}$ area 2A4 may include a curved surface. Alternatively, at least one of the $1^{st}$ area 2A1, the $2^{nd}$ area 2A2, the $3^{rd}$ area 2A3, and the $4^{th}$ area 2A4 may be a flat surface with a certain tilt. Alternatively, at least one of the $1^{st}$ area 2A1, the $2^{nd}$ area 2A2, the $3^{rd}$ area 2A3, and the $4^{th}$ area 2A4 may be combinations of flat surfaces with different tilts.

According to an embodiment of the present disclosure, the back side B may include a central area 2A surrounded by the $1^{st}$ area 2A1, the $2^{nd}$ area 2A2, the $3^{rd}$ area 2A3, and the $4^{th}$ area 2A4.

According to an embodiment of the present disclosure, the central area 2A may have a rectangular or quadrangular shape as illustrated in FIG. 1A, but is not limited thereto. Further, the central area 2A may include a flat surface and/or a curved surface.

According to an embodiment of the present disclosure, the screen area of the display may overlap with the central area 2A of the back side B, and may not overlap with the $1^{st}$ area 2A1, the $2^{nd}$ area 2A2, the $3^{rd}$ area 2A3, and the $4^{th}$ area 2A4.

According to an embodiment of the present disclosure, the bezel 3 may include a neighboring $1^{st}$ corner portion 2C1 to which the $1^{st}$ edge 2E1 and the $3^{rd}$ edge 2E3 are connected. The bezel 3 may include a neighboring $2^{nd}$ corner portion 2C2 to which the $1^{st}$ edge 2E1 and the $4^{th}$ edge 2E4 are connected. Further, the bezel 3 may include a $1^{st}$ connection portion 2L1 for providing a connection between the $1^{st}$ corner portion 2C1 and the $2^{nd}$ corner portion 2C2. The $1^{st}$ corner portion 2C1 and/or the $2^{nd}$ corner portion 2C2 may protrude relatively less than the $1^{st}$ connection portion 2L1 in a direction from the front side F to the back side B. For example, from a cross-sectional view, at least one part of the $1^{st}$ corner portion 2C1 and/or the $2^{nd}$ corner portion 2C2 may not be thicker than the $1^{st}$ connection portion 2L1 in the direction from the front side F to the back side B of the electronic device 100.

According to an embodiment of the present disclosure, the bezel 3 may include a neighboring $3^{rd}$ corner portion 2C3 to which the $2^{nd}$ edge 2E3 and the $3^{rd}$ edge 2E3 are connected. The bezel 3 may include a neighboring $4^{th}$ corner portion 2C4 to which the $2^{nd}$ edge 2E2 and the $4^{th}$ edge 2E4 are connected. Further, the bezel 3 may include a $2^{nd}$ connection portion 2L2 for providing a connection between the $3^{rd}$ corner portion 2C3 and the $4^{th}$ corner portion 2C4. The $3^{rd}$ corner portion 2C3 and/or the $4^{th}$ corner portion 2C4 may protrude relatively less than the $2^{nd}$ connection portion 2L2 in the direction from the front side F to the back side B. For example, from a cross-sectional view, at least one part of the $3^{rd}$ corner portion 2C3 and/or the $4^{th}$ corner portion 2C4 may not be thicker than the $2^{nd}$ connection portion 2L2 in the direction from the front side F to the back side B of the electronic device 100.

According to an embodiment of the present disclosure, the bezel 3 may include a $3^{rd}$ connection portion 2L3 for providing a connection between the $1^{st}$ corner portion 2C1 and the $3^{rd}$ corner portion 2C3. Further, the $1^{st}$ corner portion 2C1 and/or the $3^{rd}$ corner portion 2C3 may protrude relatively less than the $3^{rd}$ connection portion 2L3 in the direction from the front side F to the back side B. For example, from a cross-sectional view, at least one part of the $1^{st}$ corner portion 2C1 and/or the $3^{rd}$ corner portion 2C3 may not be thicker than the $3^{rd}$ connection portion 2L3 in the direction from the front side F to the back side B of the electronic device 100.

According to an embodiment of the present disclosure, the bezel 3 may include a $4^{th}$ connection portion 2L4 for providing a connection between the $2^{nd}$ corner portion 2C2 and the $4^{th}$ corner portion 2C4. The $2^{nd}$ corner portion 2C2 and/or the $4^{th}$ corner portion 2C4 may protrude relatively less than the $4^{th}$ connection portion 2L4 in the direction from the front side F to the back side B. For example, from a cross-sectional view, at least one part of the $2^{nd}$ corner portion 2C2 and/or the $4^{th}$ corner portion 2C4 may not be thicker than the 4$^{th}$ connection portion 2L4 in the direction from the front side F to the back side B of the electronic device 100.

According to an embodiment of the present disclosure, the corner portions 2C1, 2C2, 2C3, and 2C4 may each have a round shape capable of being smoothly connected to the connection portions 2L1, 2L2, 2L3, and 2L4.

According to an embodiment of the present disclosure, the corner portions 2C1, 2C2, 2C3, and 2C4 may protrude relatively less than the connection portions 2L1, 2L2, 2L3, and 2L4 in a direction orthogonal to the direction from the front side F to the back side B of the electronic device 100. For example, from a cross-sectional view, it may be thicker than the connection portions 2L1, 2L2, 2L3, and 2L4 in a direction orthogonal to the direction from the back side B to the front side F of the electronic device 100.

According to an embodiment of the present disclosure, the front cover 1 may include a through-hole 1H1 for supporting a speaker or receiver equipped in the electronic device 100. A sound from the speaker or the receiver may be output through the through-hole 1H1.

According to an embodiment of the present disclosure, the front cover 1 may include at least one of transparent areas 1T1 and 1T2 for supporting an optical related component (e.g., an illumination sensor, an image sensor, a proximity sensor, etc.) equipped in the electronic device 100. External light may be introduced to the optical related component through the transparent areas 1T1 and 1T2. Further, light from the optical related component may be projected through the transparent areas 1T1 and 1T2.

According to an embodiment of the present disclosure, the front cover 1 may include a through-hole 1H2 for supporting a button equipped in the electronic device 100. The button may be exposed to the outside through the through-hole 1H2.

According to an embodiment of the present disclosure, the back cover 2 may include a through-hole 2H1 for a camera equipped in the electronic device 100. The camera may be exposed to the outside through the through-hole 2H1. Alternatively, the through-hole 2H1 may include a through-hole or transparent area 2H2 for a flash equipped in the electronic device 100. Light from the flash may be emitted externally through the through-hole 2H1 or the transparent area 2H2. Alternatively, the back cover 2 may include a through-hole 2H3 for supporting a speaker equipped in the electronic device 100. Sound from the speaker may be output through the through-hole 2H3.

According an embodiment of the present disclosure, the bezel 3 may include a through-hole 3H1 for supporting a microphone equipped in the electronic device 100. Sound may be introduced to the microphone through the through-hole 3H1.

According to an embodiment of the present disclosure, the bezel 3 may include a through-hole 3H2 for supporting a connector (e.g., a universal serial bus (USB) socket, a charging jack, a communication jack, an ear jack, etc.) equipped in the electronic device 100. An external device may be connected to a connector of the electronic device 100 through the through-hole 3H2.

According to an embodiment of the present disclosure, the bezel 3 may include one or more through-holes 3H41 and 3H42 for supporting one or more buttons equipped in the electronic device 100. The one or more buttons may be exposed through the through-holes 3H41 and 3H42.

According to an embodiment of the present disclosure, the bezel 3 may include a through-hole 3H5 for supporting an ear jack equipped in the electronic device 100. An ear plug may be coupled to the ear jack through the through-hole 3H5.

According to an embodiment of the present disclosure, the bezel 3 may include a plurality of segment portions 3P1, 3P2, 3P3, and 3P4. The bezel 3 may include a plurality of segment durations 3P12, 3P13, 3P24, and 3P34 distinguished by the plurality of segment portions 3P1, 3P2, 3P3, and 3P4. If the bezel 3 is a metal bezel, a structure constructed of the plurality of segment durations 3P12, 3P13, 3P24, and 3P34 may prevent performance deterioration of an antenna equipped inside the electronic device 100.

According to an embodiment of the present disclosure, at least one of the plurality of segment durations 3P12, 3P13, 3P24, and 3P34 may be used as an antenna radiator which radiates an electromagnetic wave by directly receiving electrical current.

According to an embodiment of the present disclosure, at least one of the plurality of segment durations 3P12, 3P13, 3P24, and 3P34 may be used as an antenna radiator which radiates an electromagnetic wave by indirectly receiving electrical current (e.g., electrical current supplied electromagnetically from a feeding portion).

Figure 3A:
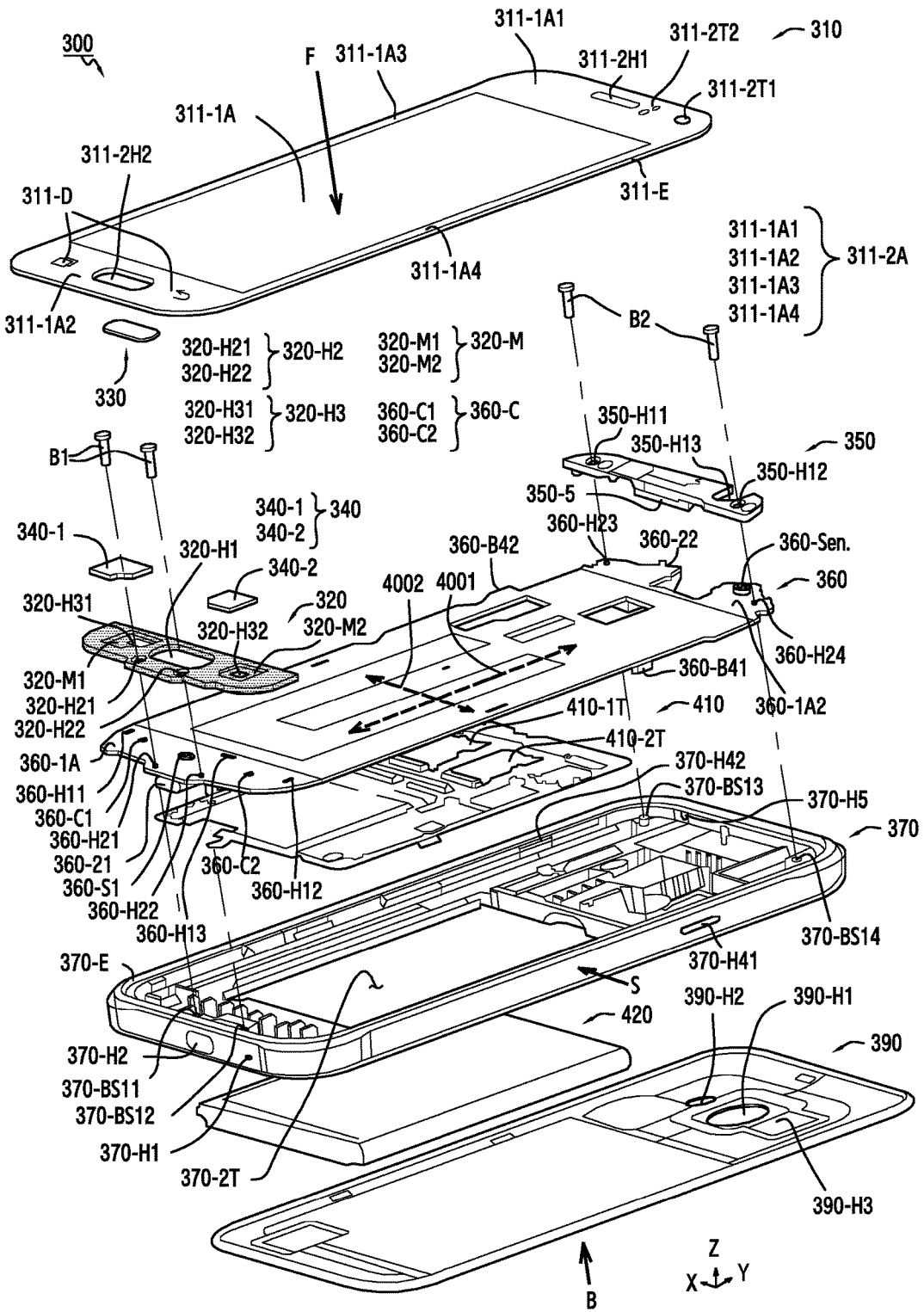
FIG. 3A is an exploded perspective view of an electronic device according to an embodiment of the present disclosure.
Figure 3B:
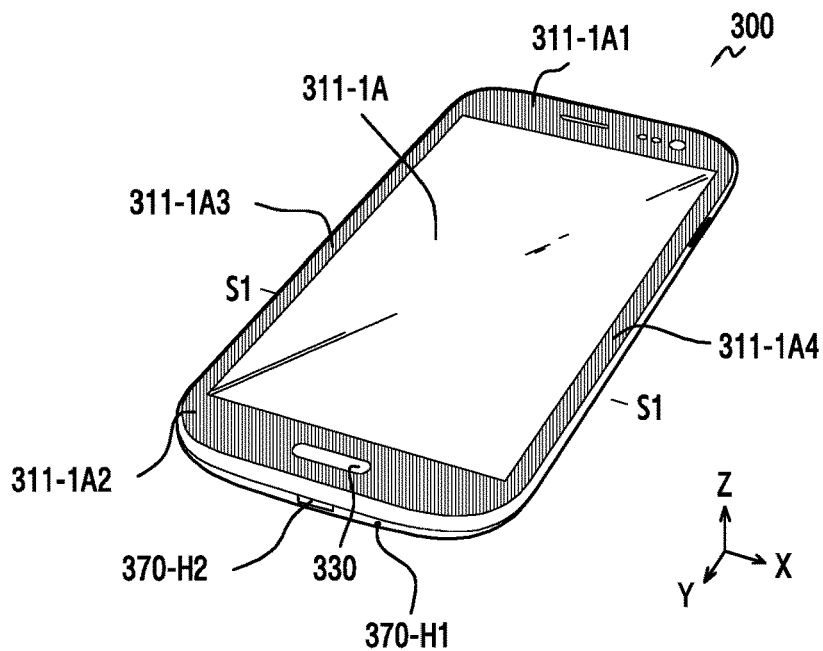
FIGS. 3B and 3C are diagrams of an electronic device and a cross-sectional view of another electronic device, respectively, according to an embodiment of the present disclosure.
Figure 3C:
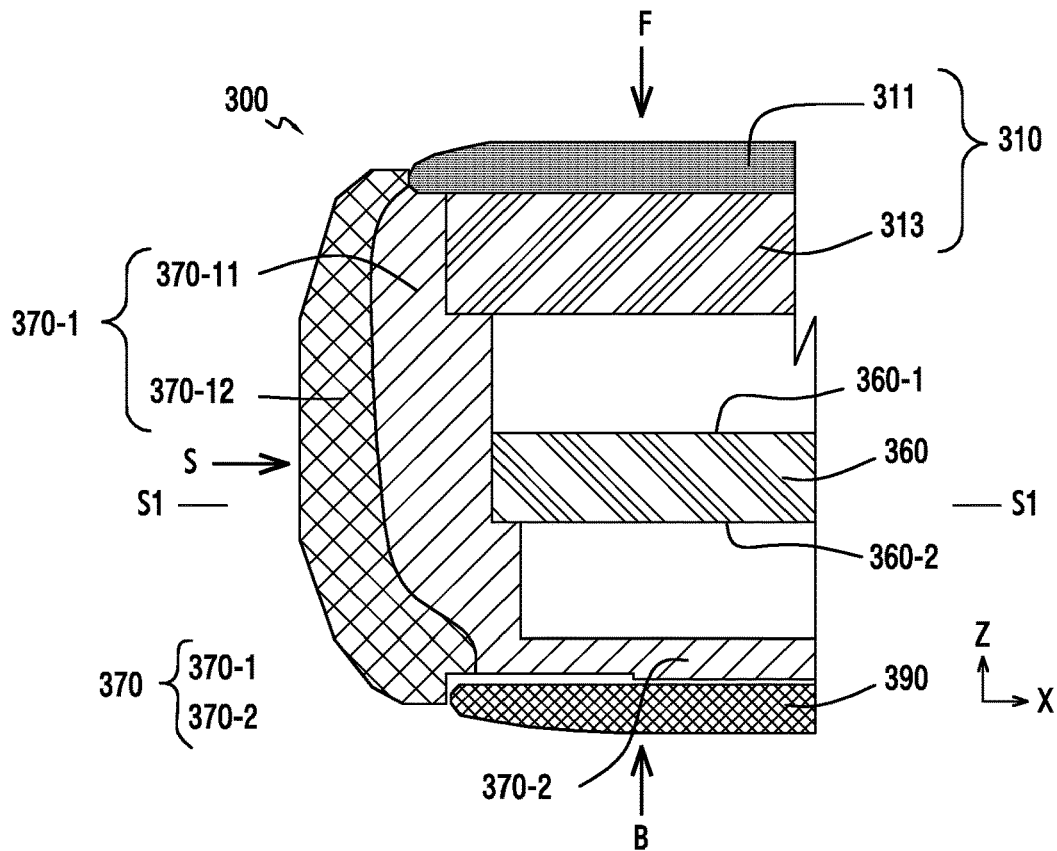

FIG. 3A is an exploded perspective view of an electronic device 300 according to an embodiment of the present disclosure. In addition, FIGS. 3B and 3C is a diagram of an electronic device and a cross-sectional view of another electronic device 300 according to an embodiment of the present disclosure. Herein, a configuration for one part of the electronic device 300 is provided, and such a configuration may not be applied to the entirety of the electronic device 300.

Referring to FIGS. 3A-3C, the electronic device 300 may include a display device 310, a circuit board 360, a spacer 320, a button plate 340, a case frame 370, and a cover 390.

According to an embodiment of the present disclosure, the display unit 310 may include a window 311 and a display 313.

According to an embodiment of the present disclosure, the window 311 may have an approximately plate-like shape, and may include a light transmitting material (e.g., plastic, glass, etc.) having impact resistance. The window 311 may be coupled to the case frame 370, and may form a front side F of the electronic device 300. For example, a circular-shaped edge 311-E of the window 311 may be coupled to a circular-shaped window install portion 370-E of the case frame 370 by using a coupling means (e.g., double-sided tape). If the window 311 and the case frame 370 are coupled, a space capable of containing the display 313 and the circuit board 360 may be provided. Herein, the display 313 may be coupled to the window 311.

According to an embodiment of the present disclosure, the window 311 may include a transparent 1$^{st}$ area 311-1A and an opaque 2$^{nd}$ area 311-2A. The 1$^{st}$ area 311-1A overlaps with an image display area of the display 313, and an image of the display 313 may be visible externally through the 1$^{st}$ area 311-1A. For example, the 1$^{st}$ area 311-1A has a rectangular shape, and may be a central area 1A of the electronic device 100 of FIG. 1.

According to an embodiment of the present disclosure, the 2$^{nd}$ area 311-2A is a circular-shaped area which surrounds the 1$^{st}$ area 311-1A, and may include a 1$^{st}$ edge area 311-1A1, a 2$^{nd}$ edge area 311-1A2, a 3$^{rd}$ edge area 311-1A3, and a 4$^{th}$ edge area 311-1A4.

According to an embodiment of the present disclosure, the 1$^{st}$ edge area 311-1A1 and the 2$^{nd}$ edge area 311-1A2 may be disposed at opposite sides in a long-length direction of the rectangular window 311. The 3$^{rd}$ edge area 311-1A3 and the 4$^{th}$ edge area 311-1A4 may be disposed at opposite sides in a short-length direction of the rectangular window 311.

According to an embodiment of the present disclosure, the 1$^{st}$ edge area 311-1A1 and the 2$^{nd}$ edge area 311-1A2 may have a relatively wider width than the 3$^{rd}$ edge area 311-1A3 and the 4$^{th}$ edge area 311-1A4.

According to an embodiment of the present disclosure, the 2$^{nd}$ area 311-2A may include a plurality of through-holes. For example, the window 311 may include a sound output supporting hole 311-2H1 disposed to the 2$^{nd}$ area 311-2A (e.g., the 1$^{st}$ edge area 311-1A1). Sound from a speaker or a receiver equipped in the electronic device 300 may be output through the sound output supporting hole 311-2H1. For example, the window 311 may include a button supporting hole 311-2H2 disposed to the 2$^{nd}$ area 311-2A (e.g., the 1$^{st}$ edge area 311-1A1). The button 330 equipped in the electronic device 300 may be exposed to the outside by being engaged into the button supporting hole 311-2H2.

According to an embodiment of the present disclosure, the window 311 may include at least one of sensor supporting areas 311-2T1 and 311-2T2 disposed to the 2$^{nd}$ area 311-2A (e.g., the 1$^{st}$ edge area 311-1A1). For example, the sensor supporting areas 311-2T1 and 311-2T2 may be configured to support an optical related sensor (e.g., an illumination sensor, an image sensor, or a proximity sensor) equipped in the electronic device 300.

According to an embodiment of the present disclosure, the display 313 may be disposed between the window 311 and the circuit board 360. The display 313 is configured to display an electrical signal provided from the circuit board 360 in a form of an image, and may include a liquid crystal display (LCD), an organic light emitting diode (OLED) display (e.g., an active matrix OLED (AM-OLED), or the like.

According to an embodiment of the present disclosure, the display device 310 may further include a touch panel, touch sensor, or touch electrode for a touch input or a hovering input. For example, a touch panel may be disposed between the window 311 and the display 313. Alternatively, the display device 310 may further include a panel (e.g., a pen sensor or a digitizer) supporting an input using an electronic pen or a stylus. The display device 310 may support the touch input or the hovering input through the 1$^{st}$ area 311-1A of the window 311.

According to an embodiment of the present disclosure, the display device 310 may provide a display integrated touch screen. For example, the display device 310 may be an AM-OLED integrated touch screen (i.e., an on-cell touch sensor panel (TSP) AM-OLED (OCTA)).

According to an embodiment of the present disclosure, the circuit board 360 (or a main board, a mother board, a printed circuit board (PCB), or a printed board assembly (PBA)) may be configured to have a plurality of electronic components and to include an electrical circuit for connecting the components. The circuit board 360 may configure an execution environment of the electronic device 300, maintain information thereof, and support data input/output exchange of devices included in the electronic device 300.

According to an embodiment of the present disclosure, the circuit board 360 may include a 1$^{st}$ side 360-1 and a 2$^{nd}$ side 360-2 configured to be capable of mounting electronic components. The 1$^{st}$ side 360-1 may be configured to be directed to the front side F of the electronic device 300, and the 2$^{nd}$ side 360-2 may be configured to be directed to the back side B of the electronic device 300.

According to an embodiment of the present disclosure, the circuit board 360 may include a pressing switch 360-S1 mounted to the 1$^{st}$ side 360-1. The pressing switch 360-S1 may be located vertically below a button 330. If the button 330 moves vertically downward by pressing, the pressing switch 360-S1 may be electrified between two contact points. For example, the pressing switch 360-S1 may be a dome switch, a toggle switch, or the like.

According to an embodiment of the present disclosure, the circuit board 360 may include one or more contacts 360-C mounted to the 1$^{st}$ side 360-1 and supporting a touch or hovering input. For example, one pair of contacts 360-C1 and 360-C2 may be configured, and the pressing switch 360-S1 may be disposed between the pair of contacts 360-C1 and 360-C2. The circuit board 360 may include an input circuit electrically or operably connected to one or more contacts 360-C. The input circuit may determine whether a touch or hovering input occurs on the basis of a change in capacitance. For example, if a change amount of a capacitance is greater than or equal to a threshold, the input circuit may recognize that a touch input occurs. The change amount of a capacitance may be triggered due to a proximity of a conductive material (e.g., a finger).

According to an embodiment of the present disclosure, the one or more contacts 360-C may be disposed vertically below the 2$^{nd}$ edge area 311-1A2 of the 2$^{nd}$ area 311-2A of the window 311.

According to an embodiment of the present disclosure, the circuit board 360 may include at least one sensor 360-Sen (e.g., an illumination sensor, an image sensor, a proximity sensor, etc.) mounted to the 1$^{st}$ side 360-1. The at least one sensor 360-Sen may be disposed to use at least one of sensor supporting areas 311-2T1 and 311-2T2 formed in the 2$^{nd}$ area 311-2A of the window 311.

According to an embodiment of the present disclosure, the circuit board 360 may include a microphone mounted to the 2$^{nd}$ side 360-2. The microphone may be located in proximity to a through-hole 370-H1 for supporting the microphone formed in the case frame 370.

According to an embodiment of the present disclosure, the circuit board 360 may include one or more pressing switches mounted to the 2$^{nd}$ side 360-2. For example, one pressing switch 360-B41 may be used for a function of power on/off, screen on/off, or the like, and may be located in proximity to a through-hole 370-H41 for supporting a button formed in the case frame 370. For example, the other pressing switch 360-B41 may be used for a sound volume control, and may be located in proximity to a through-hole 370-H42 formed in the case frame 370. Herein, the two pressing switches 360-B41 and 360-B42 may be disposed at opposite sides in a short-length direction 4002 of the electronic device 300.

According an embodiment of the present disclosure, the circuit board 360 may include one or more connectors mounted to the 2$^{nd}$ side 360-2. For example, one connector 360-21 may be located vertically below the button 330. Further, the connector 360-21 may be located in proximity to a through-hole 370-H2 for supporting a connector formed in the case frame 370. The connector 360-21 may be a USB socket, a charging jack, a communication jack, or the like. For example, the other connector 360-22 may be an ear jack, and may be located in proximity to a through-hole 370-H5 for supporting the ear jack formed in the case frame 370. Herein, the two connectors 360-21 and 360-22 may be disposed at opposite sides in a long-length direction 4001 of the electronic device 300.

According to an embodiment of the present disclosure, the circuit board 360 may include a plurality of through-holes 360-H21, 360-H22, 360-H23, and 360-H24 for supporting bolt fastening. For example, one pair of through-holes 360-H21 and 360-H22 may be disposed respectively to both sides of the connector 360-21. Another through-hole 360-H23 may be disposed to a corner portion of the circuit board 360 around the ear jack 360-22. Another through-hole 360-H24 may be disposed to a corner portion of the circuit board 360 around at least one sensor 360-Sen (e.g., an image sensor or a camera sensor). The ear jack 360-22 and at least one sensor 360-Sen may be disposed between the two through-holes 360-23 and 360-24.

According to an embodiment of the present disclosure, the circuit board 360 may include a spacer installing area 360-1A formed on the $1^{st}$ side 360-1. The spacer installing area 360-1A may be disposed vertically below the $2^{nd}$ edge area 311-1A2 of the $2^{nd}$ area 311-2A of the window 311.

According to an embodiment of the present disclosure, the aforementioned pressing switch 360-S1 and pair of contacts 360-C1 and 360-C2 may be disposed to the spacer installing area 360-1A.

According to an embodiment of the present disclosure, the spacer installing area 360-1A may include a plurality of through-holes 360-H11, 360-H12, and 360-H13 for supporting a coupling between the spacer 320 and the circuit board 360. For example, although not shown, the spacer 320 may include a plurality of hooks extended in a direction from the front side F to the back side B of the electronic device 300. The spacer 320 may be inserted into the plurality of through-holes 360-H11, 360-H12, and 360-H13 of the circuit board 360 and thereafter may be snap-fit coupled to the circuit board 360.

According to an embodiment of the present disclosure, the spacer installing area 360-1A may include a plurality of through-holes for supporting bolt fastening among the spacer 320, the circuit board 360, and case frame 370. For example, the spacer installing area 360-1A may include one pair of through-holes 360-H21 and 360-H22 disposed respectively to both sides of the connector 360-21.

According to an embodiment of the present disclosure, the spacer 320 may be disposed between the display device 310 and the circuit board 360. For example, the spacer 320 may be disposed between the circuit board 360 and the spacer installing area 360-1A. The spacer 320 may have an approximately plate-like shape corresponding to the spacer installing area 360-1A.

According to an embodiment of the present disclosure, at least one part of the spacer 320 may be formed of a metallic or non-metallic material.

According to an embodiment an embodiment of the present disclosure, the spacer 320 may include a through-hole 320-H1 disposed vertically below the button 330 to support the button 330 and the pressing switch 360-S1 of the circuit board 360. The button 330 may move vertically downward by being pressed through the through-hole 320-H1 to press the pressing switch 360-S1, and the pressing switch 360-S1 may be electrified.

According to an embodiment, the spacer 320 may include one or more through-holes 320-H3 for supporting a touch or hovering input using one or more contacts 360-C installed to the circuit board 360. For example, the spacer 320 may include one pair of through-holes 320-H31 and 320-H32. The through-hole 320-H1 for supporting the button 330 may be disposed between the pair of through-holes 320-H31 and 320-H32 for supporting the pair of contacts 360-C (e.g., 360-C1 and 360-C2). The pair of contacts 360-C1 and 360-C2 installed in the circuit board 360 may be inserted respectively to the pair of through-holes 320-H31 and 320-H32 of the spacer 320.

According to an embodiment of the present disclosure, the spacer 320 may include one or more button plate installing grooves 320-M1 and 320-M2. For example, the pair of button plate installing grooves 320-M1 and 320-M2 may have a concave shape in a direction from the front side F to the back side B of the electronic device 300, and a space of the pair of button plate installing grooves 320-M1 and 320-M2 may be connected respectively to the pair of through-holes 320-H31 and 320-H32.

According to an embodiment of the present disclosure, one or more button plates 340 (e.g. 340-1 and 340-2) may be coupled to one or more button plate installing grooves 320-M of the spacer 320. For example, the pair of button plates 340-1 and 340-2 may be coupled to the pair of button plate installing grooves 320-M1 and 320-M2 by using a coupling means (e.g., double-sided tape). The pair of button plates 340 may have a shape capable of being engaged respectively into the pair of button plate installing grooves 320-M.

According to an embodiment of the present disclosure, if one or more button plates 340 are coupled to one or more button plate installing grooves 320-M, the one or more button plates 340 may relatively or may not protrude from one side of the spacer 320 facing the window 311.

According to an embodiment of the present disclosure, the one or more button plates 340 may be at least partially formed of a metallic material, and may be electrically or operably connected to the one or more contacts 360-C of the circuit board 360. For example, if the one or more button plates 340 are coupled to the one or more button plate installing grooves 320-M, one metallic side of the one or more button plates 340 may be located in an opening portion in one side of the one or more through-holes 320-H3 of the spacer 320. Further, the one or more contacts 360-C of the circuit board 360 inserted to the one or more through-holes 320-H2 of the spacer 320 may be in contact with the one metallic side of the one or more button plates 340.

According to an embodiment of the present disclosure, the one or more contacts 360-C of the circuit board 360 may have elasticity, and thus an electrical connection between the one or more contacts 360-C and the one or more button plates 340 may be maintained. For example, before the one or more button plates 340 are installed to the one or more button plate installing grooves 320-M, a free end of the one or more contacts 360-C may be introduced to a space of the one or more button plate installing grooves 320-M of the spacer 320. If the one or more button plates 340 are installed to the one or more button plate installing grooves 320-M of the spacer 320, the one or more button plates 340 may press the free end of the one or more contacts 360-C vertically downward while being electrically in contact therewith, and the free end of the one or more contacts 360-C may be pushed to the space of the one or more through-holes 320-H of the spacer 320 by being elastically supported.

According to an embodiment of the present disclosure, the one or more contacts 360-C installed in the circuit board 360 may include a conductive material and may have elasticity. For example, the one or more contacts 360-C may be a C-clip, a pogo-pin, a spring, conductive PORON® and rubber, conductive tape, a cooper connector, or the like.

According to an embodiment of the present disclosure, an input circuit of the circuit board 360 may provide electrical current to the one or more button plates 340 through the one or more contacts 360-C. The one or more button plates 340 may form a capacitor having a capacitance by means of the electrical current. Since the window 311 covers the one or more button plates 340, an external conductive material (e.g., a finger) does not easily touch directly the one or more button plates 340, and may be in proximity to the one or more button plates 340 by means of the window 311. If the external conductive material is in proximity to the one or more button plates 340, there may be a change in capacitance, and the input circuit may detect this and recognize an occurrence of a touch input. Herein, an indication may be provided to areas 311-D in which a touch or hovering input is possible by using the one or more contacts 360-C in the $2^{nd}$ edge area 311-1A2 of the $2^{nd}$ area 311-2A of the window 311. These areas 311-D may be in proximity to the button plates 340.

According to an embodiment of the present disclosure, the spacer 320 may include a plurality of bolt fastening holes for supporting bolt fastening. For example, the spacer 320 may include one pair of bolt fastening holes 320-H21 and 320-H22 disposed vertically above one pair of through-holes 360-H21 and 360-H22.

According to an embodiment of the present disclosure, a gap between the button plate 340 and the circuit board 360 may be maintained due to the spacer 320, and thus a contact point between the button plate 340 and the contact 360-C may also be maintained. For example, even if an impact is applied to a position on the window 311 corresponding to the contact 360-C, the contact point between the button plate 340 and the contact 360-C may be maintained, and thus malfunctions of an input circuit may be reduced. For example, even if the window 311 is not electrified (e.g., is floated), the contact point between the button plate 340 and the contact 360-C may be maintained, and thus malfunctions of the input circuit may be reduced.

According to an embodiment of the present disclosure, the electronic device 300 may further include another spacer 350. The spacer 350 may be disposed between the window 311 and the circuit board 360. The spacer 350 may have approximately a plate-like shape corresponding to the spacer installing area 360-1A2. The spacer 320 may be disposed vertically below the $1^{st}$ edge area 311-1A1 of the window 311, and the spacers 320 and 350 may be located on opposite sides.

According to an embodiment of the present disclosure, the spacer 350 may further include a plurality of bolt fastening holes for supporting bolt fastening. For example, the spacer 350 may include a plurality of bolt fastening holes 350-H11 and 350-H12 disposed vertically above the plurality of through-holes 360-H23 and 260-H24 of the circuit board 360.

According to an embodiment of the present disclosure, the spacer 350 may include at least one sensor 360-Sen installed in the circuit board 360 and the through-hole 360-H13 disposed between at least one of sensor supporting areas 311-2T1 and 311-2T2 of the window 311. The at least one sensor 360-Sen may use the at least one of sensor supporting areas 311-2T1 and 311-2T2 of the window 311 through the through-hole 350-H13 of the spacer 350.

According to an embodiment of the present disclosure, the spacer 350 may further include a receiver device 350-5. If the spacer 350 is coupled to the circuit board 360, contacts of the receiver device 350-5 may be electrically or operably connected to the circuit board 360.

According to an embodiment of the present disclosure, a gap between the display device 310 and the circuit board 360 may be maintained due to the spacers 320 and 350. For example, the gap between the window 311 and the circuit board 360 may be maintained.

According to an embodiment an embodiment of the present disclosure, the case frame 370 may have approximately a container-like shape which is open in the direction from the back side B to the front side F of the electronic device 300, and may form an overall frame of the electronic device 300. Electronic components (e.g., the display device 310, the circuit board 320, etc.) may be installed with a framework structure constructed of the case frame 370.

According to an embodiment of the present disclosure, the case frame 370 may include the $1^{st}$ portion 370-1 for forming a lateral side S of the electronic device 300 and a $2^{nd}$ portion 370-2 extended from the $1^{st}$ portion 370-1 and disposed between the circuit board 360 and the cover 390.

According to an embodiment of the present disclosure, the $1^{st}$ portion 370-1 of the case frame 370 may include the through-hole 370-H1 for supporting a microphone equipped in the electronic device 300.

According to an embodiment of the present disclosure, the $1^{st}$ portion 370-1 of the case frame 370 may include the through-hole 370-H2 for supporting a connector (e.g., a USB socket, a charging jack, a communication jack, an ear jack, etc.) equipped in the electronic device 300.

According to an embodiment of the present disclosure, the $1^{st}$ portion 370-1 of the case frame 370 may include one or more through-holes 370-H41 and 370-H42 for supporting one or more buttons equipped in the electronic device 300.

According to an embodiment of the present disclosure, the $1^{st}$ portion 370-1 of the case frame 370 may include the through-hole 370-H5 for supporting an ear jack equipped in the electronic device 300.

According to an embodiment of the present disclosure, the $1^{st}$ portion 370-1 of the case frame 370 may include an inner portion 370-11 and an outer portion 370-12 which overlap in a direction orthogonal to the direction from the back side B to the front side F of the electronic device 300. The outer portion 370-12 may have a rounded shape, and for example, may include the bezel 3 of the electronic device 100 of FIG. 1.

According to an embodiment of the present disclosure, the $2^{nd}$ portion 370-2 of the case frame 370 may have a shape capable of being coupled to the circuit board 360, and the circuit board 360 may be placed on the case frame 370 without being floated. For example, the $2^{nd}$ portion 370-2 may have a plurality of various-shaped ribs extended to the $2^{nd}$ side 360-2 of the circuit board 360, where these ribs may be configured to support the circuit board 360.

According to an embodiment of the present disclosure, the $2^{nd}$ portion 370-2 of the case frame 370 may include a plurality of bosses for supporting bolt fastening. For example, the $2^{nd}$ portion 370-2 of the case frame 370 may include a plurality of bosses 370-BS11, 370-BS12, 370-B13, and 370-B14 disposed vertically below the plurality of through-holes 360-H21, 360-H22, 360-H23, and 360-H24 of the circuit board 360.

According to an embodiment of the present disclosure, the spacers 320 and 350, the circuit board 360, and the case frame 370 may be coupled to each other by using a plurality of bolts B1 and B2. The bolts B1 and B2 may be fastened in the direction from the front side F to the back side B of the electronic device 300.

According to an embodiment of the present disclosure, the $2^{nd}$ portion 370-2 of the case frame 370 may include a battery pack containing portion 370-2T for providing a space for containing a battery packet 420.

According to an embodiment of the present disclosure, the electronic device 300 may further include a conductive member 410 coupled to the $2^{nd}$ side 360-2 of the circuit board 360. For example, the conductive member 410 may further include a shield (hereinafter, the conductive member is referred to as the shield). The shield 410 may play a role in shielding noise generated in the electronic device 300. The battery pack containing portion 370-2T may have a shape capable of penetrating in the direction from the back side B to the front side F of the electronic device 300. The shield 410 may be configured to block one side of the battery pack containing portion 370-2T and may be formed in a container-like shape which is open in the direction from the front side F to the back side B of the electronic device 300.

According to an embodiment of the present disclosure, the shield 410 may include one or more through-holes 410-1T and 410-2T for supporting one or more memory sockets installed to the $2^{nd}$ side 360-2 of the circuit board 360. The one or more memory sockets may be exposed through the one or more through-holes 410-1T and 410-2T of the shield 410. For example, if the battery pack 420 is separated in a state in which the cover 390 is separated, since one or more memory sockets are exposed, a memory may be attached/detached.

According to an embodiment of the present disclosure, the case frame 370 may include a conductive material, and may be configured to be electrified on a ground plane of the circuit board 360. For example, the conductive material may be coated on one side of the $2^{nd}$ portion 370-2 of the case frame 370. Electrical current may flow between the conductive material of the case frame 370 and the ground plane of the circuit board 360 by bringing a rib of the $2^{nd}$ portion 370-2 into contact with the ground plane of the circuit board 360. Herein, the rib of the $2^{nd}$ portion 370-2 may include a conductive rubber gasket elastically in contact with the ground plane of the circuit board 360.

According to an embodiment of the present disclosure, the cover 390 may be coupled to the $2^{nd}$ portion 370-2 of the case frame 370, and may form the back side B of the electronic device 300. The cover 390 may have a curved shape, and the back side B of the electronic device 300 may be formed as a curved surface. The $2^{nd}$ portion 370-2 of the case frame 370 has a groove for inserting the cover 390, and thus the cover 390 may be inserted without floating by engaging with the $2^{nd}$ portion 370-2 of the case frame 370. The cover 390 may be snap-fit coupled to the $2^{nd}$ portion 370-2 of the case frame 370. The cover 390 may be detached from the case frame 370 to remove an electronic component (e.g., a memory card, the battery packet 420, etc.).

According to an embodiment of the present disclosure, the cover 390 may include the through-hole 390-H1 for supporting a camera installed to the $2^{nd}$ side 360-2 of the circuit board 360. The camera may be exposed to the outside through the through-hole 390-H1.

According to an embodiment of the present disclosure, the cover 390 may include a transparent portion (or a through-hole) 390-H2 for supporting a flash installed to the $2^{nd}$ side 360-2 of the circuit board 360. Light from the flash may be emitted externally through the transparent portion.

According to an embodiment of the present disclosure, the cover 390 may include a through-hole 390-H3 for supporting a speaker installed in the $2^{nd}$ side 360-2 of the circuit board 360. Sound from the speaker may be output through the through-hole 390-H3.

According to an embodiment of the present disclosure, the window 311, the case frame 370, and the cover 390 form an exterior of the electronic device 300, and may be collectively referred to as a "housing."

According to an embodiment of the present disclosure, the electronic device 300 may further include a bracket or mounting plate disposed between the display device 310 and the circuit board 360. The bracket may have a plate-like shape. The display unit 310 may be coupled to a side directed to the front side F of the electronic device 300, and the circuit board 360 may be coupled to a side directed to the back side B of the electronic device 300.

According to an embodiment of the present disclosure, the bracket may provide rigidity to the display device 310 and the circuit board 360. Further, the bracket may be used as a heat sink which shields an electromagnetic wave, blocks electrical noise, or dissipates heat from an electronic component. The bracket may be formed of a metallic material such as magnesium (Mg), aluminum (Al), etc., or without being limited thereto, may be formed of a non-metallic material such as plastic or the like. In addition, a material for shielding an electromagnetic wave may be coated on the bracket.

According to an embodiment of the present disclosure, the bracket may be included in the display device 310.

According to an embodiment of the present disclosure, the electronic device 300 may not include the bracket. For example, the display device 310 may provide sufficient rigidity to not require the bracket.

Figure 4A:
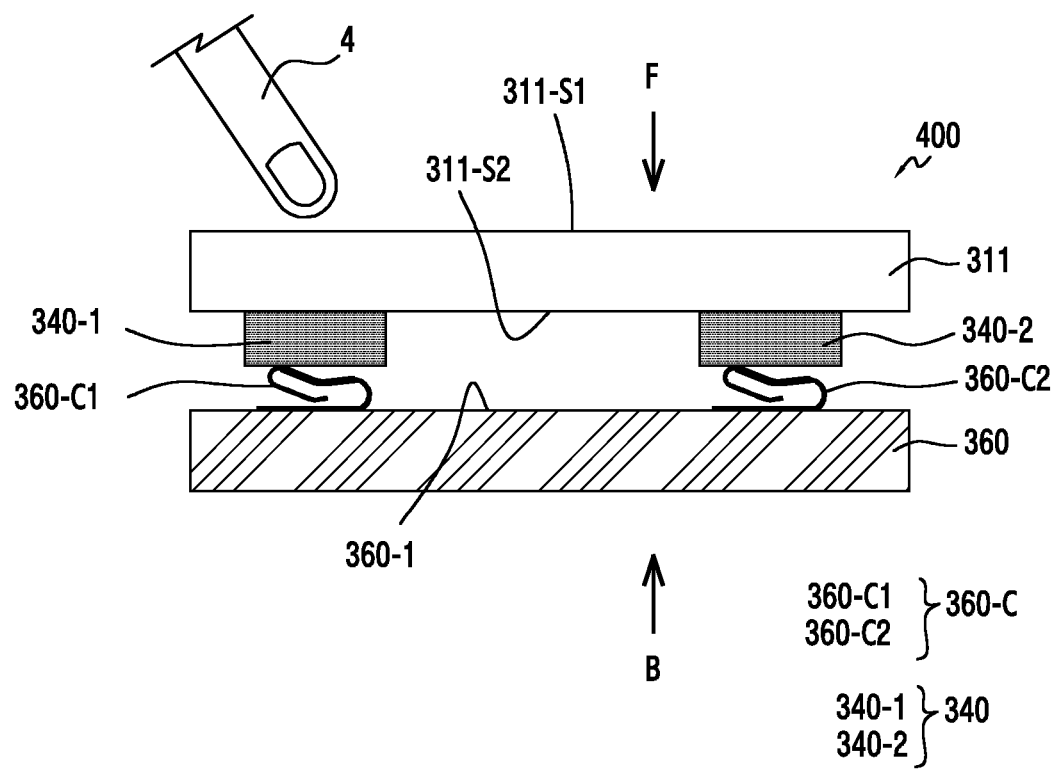
FIG. 4A is a diagram of an input device according to an embodiment of the present disclosure.

FIG. 4A is a diagram of an input device 400 according to an embodiment of the present disclosure. In addition, FIG. 4B is a diagram of a button plate 340 according to an embodiment of the present disclosure.

Figure 4B:
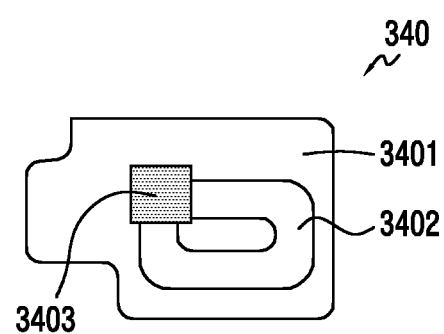
FIG. 4B is a diagram of a button plate according to an embodiment of the present disclosure.

Referring to FIG. 4A and FIG. 4B, the input device 400 may include a window 311, one or more button plates 340, a circuit board 360, and one or more contacts 360-C.

According to an embodiment of the present disclosure, the window 311 may form a front side F of the electronic device (see 300 of FIG. 3A). The window 311 may have a plate-like shape with a uniform thickness or a non-uniform thickness.

According to an embodiment of the present disclosure, the window 311 may include a $1^{st}$ side 311-S1 directed to the front side F of the electronic device 300 and a $2^{nd}$ side 311-S2 directed to a back side B of the electronic device 300.

According to an embodiment of the present disclosure, the one or more button plates 340 may be disposed between the window 311 and the circuit board 360. For example, the one or more button plates 340 may be disposed in proximity to the $2^{nd}$ side 311-S2 of the window 311.

According to an embodiment of the present disclosure, the one or more button plates 340 may include a conductive material that can form a capacitor and generate a capacitance by using an electrical current provided from the circuit board 360. Further, the one or more button plates 340 may detect a change in the capacitance and convert it to an electrical signal. The change in the capacitance may be triggered by an object (e.g., a finger 4) in proximity to a $1^{st}$ side 311-S1 of the window 311. The one or more button plates 340 may consist of conductive tape, cooper, indium tin oxide (ITO), or the like. The button plate 340 may also be referred to as an "input sensor" or a "touch sensor."

According to an embodiment of the present disclosure, the one or more button plates 340 may include a plate portion 3401, a conductive layer 3402, and a contact portion 3403.

According to an embodiment of the present disclosure, the plate portion 3401 of the button plate 340 may be formed of a non-conductive material, and may be formed in a thin-film. Further, the plate portion 3401 of the button plate 340 may be flexible.

According to an embodiment of the present disclosure, the conductive layer 3402 of the button plate 340 may be disposed on the plate portion 3401. For example, the conductive layer 3402 may be inserted into the plate portion 3401. The conductive layer 3402 may have a circular-shaped conductive pattern.

According to an embodiment of the present disclosure, the contact portion 3403 of the button plate 340 may be configured to be electrically or operably connected to the contact 360-C mounted to the circuit board 360. The contact portion 3404 may be electrically or operably connected to the conductive layer 3402.

According to an embodiment of the present disclosure, the conductive layer 3402 of the button plate 340 may form a capacitor with a capacitance by using an electrical current provided from the circuit board 360 through the contact portion 3403. Further, the button plate 340 may deliver a signal indicating a change in the capacitance to the circuit board 360 through the contact portion 3403.

According to an embodiment of the present disclosure, the one or more button plates 340 may be constructed of a flexible printed circuit board (FPCB).

According to an embodiment of the present disclosure, the one or more button plates 340 may be coupled to the $2^{nd}$ side 311-S2 of the window 311, or may be constructed as a part of the $2^{nd}$ side 311-S2. For example, the one or more button plates 340 may be a layer coupled to the $2^{nd}$ side 311-S2 of the window 311. For example, the one or more button plates 340 may be constructed on the $2^{nd}$ side 311-S2 of the window 311 through printing, coating, or the like.

According to an embodiment of the present disclosure, the circuit board 360 may be laminated on the window 311 in a direction from the front side F to the back side B of the electronic device 400. The circuit board 360 may include an input circuit for receiving a signal related to a change in the capacitance of the one or more button plates 304 and thus for recognizing an occurrence of a user input.

According to an embodiment of the present disclosure, the one or more contacts 360-C may be installed on a $1^{st}$ side 360-1 of the circuit board 360 and thus may be electrically or operably connected to the aforementioned input circuit. The one or more contacts 360-C may be disposed between the one or more button plates 340 and the circuit board 360. The one or more contacts 360-C may be electrically or operably connected to the one or more button plates 340. That is, the one or more contacts 360-C may provide an electrical connection between the one or more button plates 340 and the circuit board 360.

According to various embodiments, when a dielectric material (e.g., a finger) is in proximity to the $1^{st}$ side 311-S1 of the window 311, the capacitance generated by using the button plate 340 is changed, and the button plate 340 may deliver a signal related to the change in the capacitance to the circuit board 360 through the contact 360-C.

According to an embodiment of the present disclosure, the one or more contacts 360-C have elasticity, which may lead to an improvement in the feel of key manipulation. For example, when the $1^{st}$ side 311-S1 of the window 311 is pressed by a finger in the direction from the front side F to the back side B of the electronic device 300, a portion of the window 311 in contact with the finger may be placed to a low position by being elastically supported by the contact 360-C.

According to an embodiment of the present disclosure, a portion of the window 311 in proximity to the one or more button plates 340 may be flexible, which may further improve the aforementioned feeling of key manipulation.

Figure 5A:
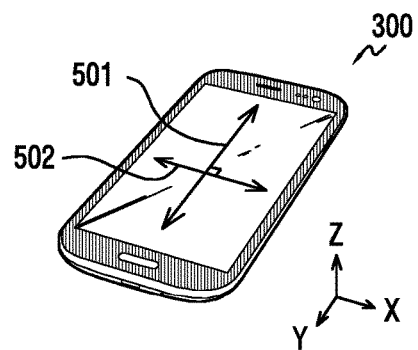
FIGS. 5A and 5B are diagrams of an electronic device and a coupling state between a spacer and a circuit board, viewed in a direction from a front side to a back side of the electronic device, respectively, according to an embodiment of the present disclosure.
Figure 5B:
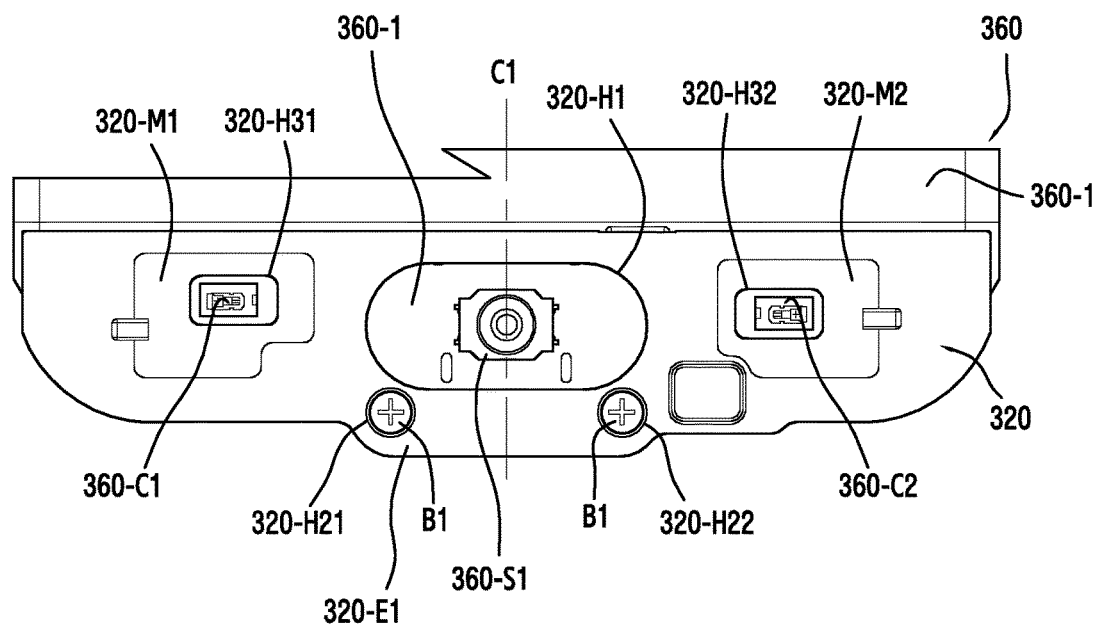
Figure 6:
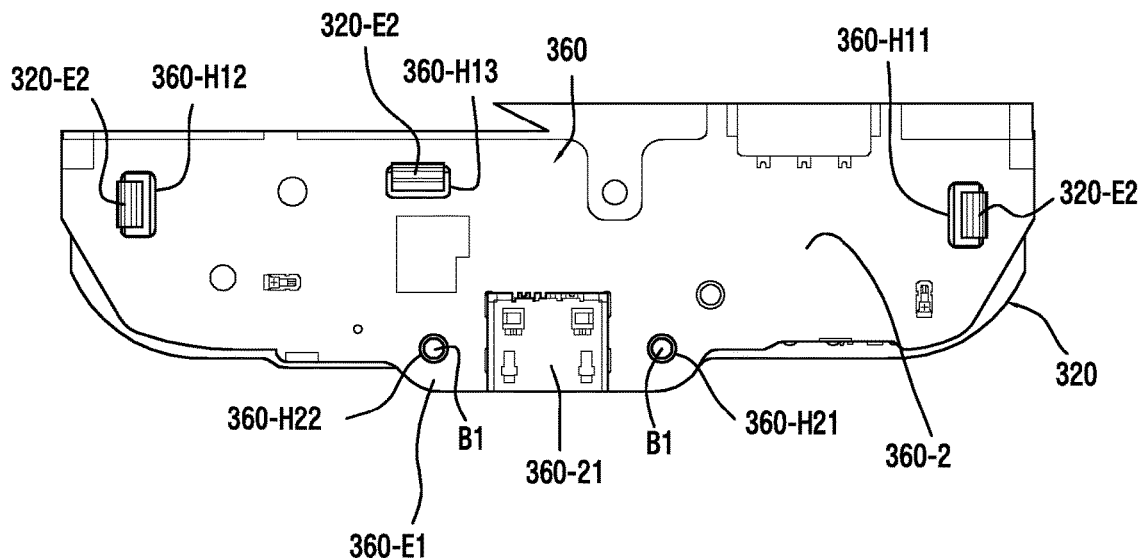
FIG. 6 is a diagram of a coupling state between a spacer and a circuit board, viewed in a direction from a back side to a front side of an electronic device, according to an embodiment of the present disclosure.
Figure 7A:
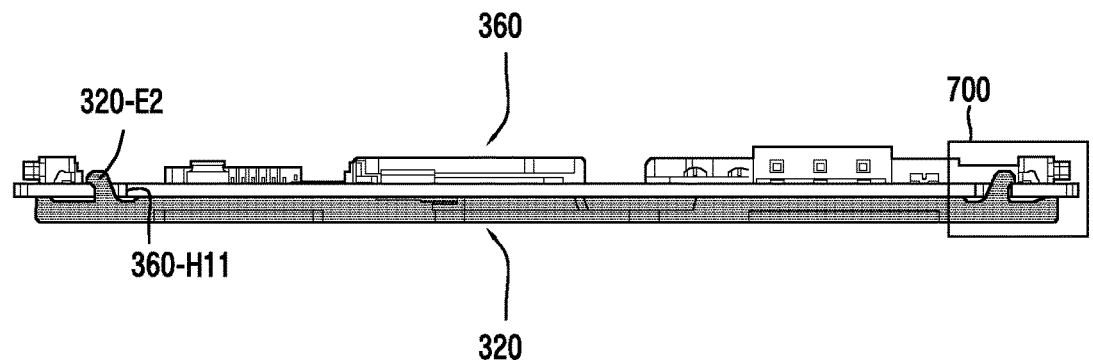
FIGS. 7A and 7B are a cross-sectional view and a partial view of a coupling state between a spacer and a circuit board, respectively, according to an embodiment of the present disclosure.
Figure 7B:
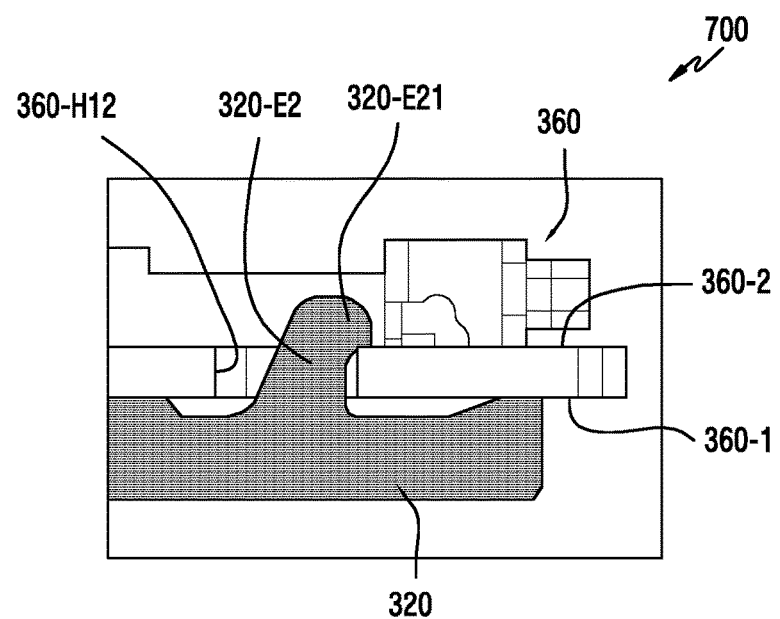

FIGS. 5A and 5B are diagrams of an electronic device and a coupling state between a spacer 320 and a circuit board 360, viewed in a direction from a front side F to a back side B of an electronic device 300, according to an embodiment of the present disclosure. FIG. 6 is a diagram of a coupling state between a spacer 320 and a circuit board 360, viewed in a direction from a back side B to a front side F of an electronic device 300, according to an embodiment of the present disclosure. In addition, FIGS. 7A and 7B are a cross-sectional view and a partial view of a coupling state between a spacer 320 and a circuit board 360, respectively, according to an embodiment of the present disclosure.

Referring to FIG. 5A to FIG. 7B, according to an embodiment of the present disclosure, the spacer 320 may have a symmetrical shape about a center line C1 in a long-length direction 501 of the approximately rectangular electronic device 300.

According to an embodiment an embodiment of the present disclosure, the spacer 320 may support a $1^{st}$ through-hole 320-H1 for supporting a pressing switch 360-S1 installed in a $1^{st}$ side 360-1 of the circuit board 360. When the spacer 320 is coupled to the circuit board 360, the pressing switch 360-S1 of the circuit board 360 may be exposed through the $1^{st}$ through-hole 320-H1 of the spacer 320. For example, the $1^{st}$ through-hole 320-H1 may be extended in a short-length direction 502 of the rectangular-shaped electronic device 300, and may include round-shaped portions at both sides.

According to an embodiment of the present disclosure, the spacer 320 may include one pair of $2^{nd}$ through-holes 320-H21 and 320-H22 for supporting bolt fastening. The pair of $2^{nd}$ through-holes 320-H21 and 320-H22 may be arranged in a short-length direction 502 of the rectangular-shaped electronic device 300. The circuit board 360 may include one pair of through-holes 360-H21 and 360-H22 for supporting bolt fastening with respect to the spacer 320. One pair of bolts B1 are coupled to the pair of $2^{nd}$ through-holes 320-H21 and 320-H22 of the spacer 320 and the pair of through-holes 360-H21 and 360-H22 of the circuit board 360, and the spacer 320 and the circuit board 360 may be coupled to each other.

According to an embodiment of the present disclosure, the spacer 320 includes an extension area 320-E1 relatively protruding in the long-length direction 501 of the rectangular-shaped electronic device 300, and the pair of $2^{nd}$ through-holes 320-H21 and 320-H22 may be disposed on this extension area 320-E1. Likewise, the circuit board 360 includes an extension area 360-E1 relatively protruding in the long-length direction 501 of the rectangular-shaped electronic device 300, and the pair of through-holes 360-H21 and 360-H22 may be disposed on this extension area 360-E1.

According to an embodiment of the present disclosure, a connector 360-21 installed in a $2^{nd}$ side 360-2 of the circuit board 360 may be disposed between the pair of through-holes 360-H21 and 360-H22 for supporting bolt fastening.

According to an embodiment of the present disclosure, the spacer 320 may include one pair of $3^{rd}$ through-holes 320-H31 and 320-H32 for supporting one pair of contacts 360-C1 and 360-C2 installed in the $2^{nd}$ side 360-2 of the circuit board 360. If the spacer 320 is coupled to the circuit board 360, the pair of contacts 360-C1 and 360-C2 of the circuit board 360 may be exposed through the pair of $3^{rd}$ through-holes 320-H31 and 320-H32 of the spacer 320.

According to an embodiment of the present disclosure, the pair of $3^{rd}$ through-holes 320-H31 and 320-H32 of the spacer 320 may be arranged in the short-length direction 502 of the rectangular-shaped electronic device 300.

According to an embodiment of the present disclosure, the $1^{st}$ through-hole 320-H1 of the spacer 320 may be disposed between the pair of $3^{rd}$ through-holes 320-H31 and 320-H32.

According to an embodiment of the present disclosure, the spacer 320 may include one pair of button plate installing grooves 320-M1 and 320-M2 for supporting one pair of button plates (see 340-1 and 340-2 of FIG. 3A). The pair of button plate installing grooves 320-M1 and 320-M2 have a concave shape in a direction from the front side F to the back side B of the electronic device 300, and a space of the pair of button plate installing grooves 320-M1 and 320-M2 may be connected respectively to the pair of through-holes 320-H31 and 320-H32.

According to an embodiment of the present disclosure, the spacer 320 may include a plurality of extension portions 320-E2 for supporting snap-fit coupling with the circuit board 360. The plurality of extension portions 320-E2 may be extended in the direction from the front side F to the back side B of the electronic device 300. The plurality of extension portions 320-E2 may include a hook-shaped free end 320-E21. The circuit board 360 may include a plurality of through-holes 360-H11, 360-H12, and 360-H13 for supporting snap-fit coupling with the spacer 320. For example, the plurality of extension portions 320-E2 of the spacer 320 may be bent due to friction between the plurality of through-holes 360-H11, 360-H12, and 360-H13 and the hook-shaped free end 320-E21 inserted in the plurality of through-holes 360-H11, 360-H12, and 360-H13 of the circuit board 360. If the free end 320-E21 of the plurality of extension portions 320-E2 of the spacer 320 completely passes through the plurality of through-holes 360-H11, 360-H12, and 360-H13 of the circuit board 360, the plurality of extension portions 320-E2 of the spacer 320 are restored to an original state, and the plurality of extension portions 320-E2 of the spacer 320 are engaged into the plurality of through-holes 360-H11, 360-H12, and 360-H13 of the circuit board 360. Accordingly, the spacer 320 and the circuit 360 may be coupled to each other.

Figure 8A:
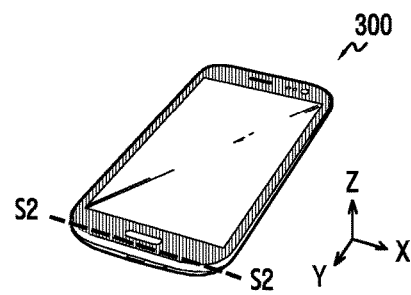
FIGS. 8A-8C are diagrams of an electronic device, a cross-sectional view, and a partial view of a coupling state among a spacer, a circuit board, a case frame, and a cover, respectively, according to an embodiment of the present disclosure.
Figure 8B:
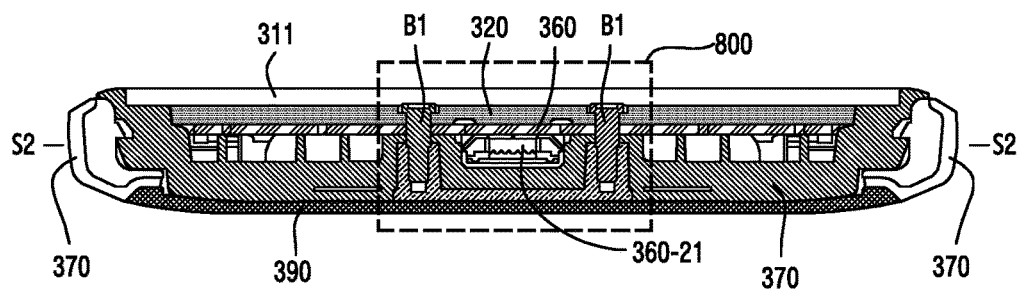
Figure 8C:
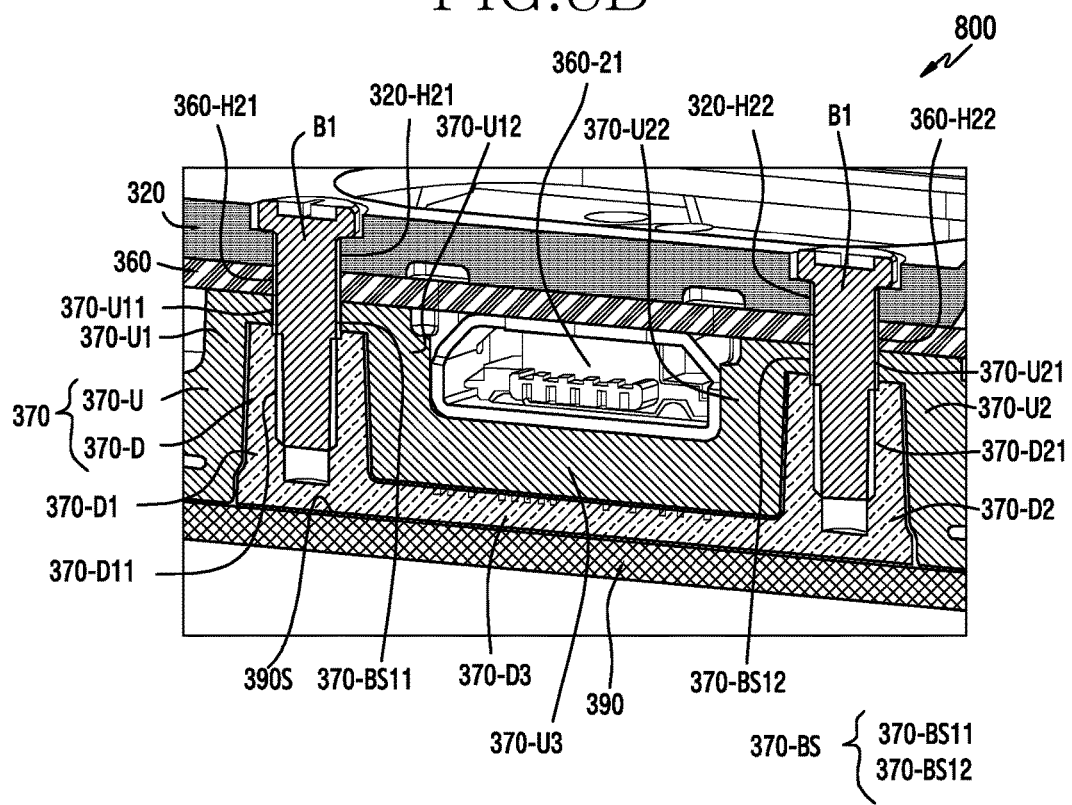

FIGS. 8A to 8C are a diagram of an electronic device 300, a cross-sectional view, and a partial view of a coupling state among a spacer 320, a circuit board 360, a case frame 370, and a cover 390 according to an embodiment of the present disclosure.

Referring to FIGS. 8A to 8C, according to an embodiment of the present disclosure, the spacer 320 may include one pair of through-holes 320-H21 and 320-H22 for supporting bolt fastening. The circuit board 360 may include one pair of through-holes 360-H21 and 360-H22 for supporting bolt fastening. Further, the case frame 370 may include one pair of bosses 370-BS11 and 370-BS12 for supporting bolt fastening. One pair of bolts B1 are coupled to the pair of through-holes 320-H21 and 320-H22 of the spacer 320, the pair of through-holes 360-H21 and 360-H22 of the circuit board 360, and the pair of bosses 370-BS11 and 370-BS12 of the case frame 370, and thus the spacer 320, the circuit board 360, and the case frame 370 may be coupled to each other.

According to an embodiment of the present disclosure, at least one part of the case frame 370 may be configured with a structure in which a plurality of members are laminated. The plurality of members may be formed of identical materials or different materials. For example, at least one part of the case frame 370 may have a structure in which $1^{st}$ and $2^{nd}$ portions 370-U and 370-D of heterogeneous materials are laminated.

According to an embodiment of the present disclosure, the $1^{st}$ portion 370-U of the case frame 370 may include one pair of portions 370-U1 and 370-U2 having an approximately U-shape, which is convex in a direction from a back side B to a front side F of an electronic device 300 and a bottom portion 370-U3 for connecting the U-shaped portions 370-U1 and 370-U2.

According to an embodiment of the present disclosure, the pair of U-shaped portions 370-U1 and 370-U2 of the $1^{st}$ portion 370-U of the case frame 370 are configured to hold the circuit board 360, and may include a side which is in contact with a $2^{nd}$ side 360-2 of the circuit board 360.

According to an embodiment of the present disclosure, the pair of "U"-shaped portions 370-U1 and 370-U2 of the $1^{st}$ portion 370-U of the case frame 370 may include through-holes 370-U11 and 370-U12.

According to an embodiment of the present disclosure, the bottom portion 370-U3 of the $1^{st}$ portion 370-U of the case frame 370 may support a shape that surrounds a connector 360-21 installed in the $2^{nd}$ side 360-2 of the circuit board 360 together with inner lateral walls 370-U21 and 370-U22 of the pair of U-shaped portions 370-U1 and 370-U2. This structure may reduce a gap between the circuit board 360 and the case frame 370, and thus may improve a coupling between the circuit board 360 and the case frame 370.

According to an embodiment of the present disclosure, from a cross-sectional view, the $2^{nd}$ portion 370-D of the case frame 370 may have an approximately U-shape which is concave in the direction from the front side F to the back side B of the electronic device 300. For example, the $2^{nd}$ portion 370-D may include a bottom portion 370-D3 and one pair of lateral walls 370-D1 and 370-D2 extended from both sides of the bottom portion 370-D3 in a direction from the back side B to the front side F.

According to an embodiment of the present disclosure, the bottom portion 360-D3 of the $2^{nd}$ portion 370-D of the case frame 370 may be in contact with the bottom portion 370-U3 of the $1^{st}$ portion 370-U. The bottom portion 370-D3 of the $2^{nd}$ portion 370-D of the case frame 370 and the bottom portion 370-U3 of the $1^{st}$ portion 370-U may form a smooth side facing one side 390S of the cover 390 facing the case frame 370.

According to an embodiment of the present disclosure, the pair of lateral walls 370-D1 and 370-D2 of the $2^{nd}$ portion 370-D of the case frame 370 may be configured to be engaged into a space of the pair of U-shaped portions 370-U1 and 370-U2 of the $1^{st}$ portion 370-U.

According to an embodiment of the present disclosure, the one pair of lateral walls 370-D1 and 370-D2 of the $2^{nd}$ portion 370-D of the case frame 370 may include bolt fastening portions 370-D11 and 370-D21 in which a screw thread is formed in an inner side of a cylinder.

According to an embodiment of the present disclosure, the pair of bosses 370-BS11 and 370-BS12 of the aforementioned case frame 370 may be formed in the pair of U-shaped portions 370-U1 and 370-U2 of the $1^{st}$ portion 370-U and the pair of lateral walls 370-D1 and 370-D2 of the $2^{nd}$ portion 370-D. For example, the pair of bolts B1 may pass through the through-holes 370-U11 and 370-U21 of the pair of U-shaped portions 370-U1 and 370-U2 of the $1^{st}$ portion 370-U and thereafter may be engaged into the bolt fastening portions 370-D11 and 370-D21 of the pair of lateral walls 370-D1 and 370-D2 of the $2^{nd}$ portion 370-D.

According to an embodiment of the present disclosure, the cover 390 is coupled to the case frame 370, and may form the back side B of the electronic device 300.

Figure 9A:
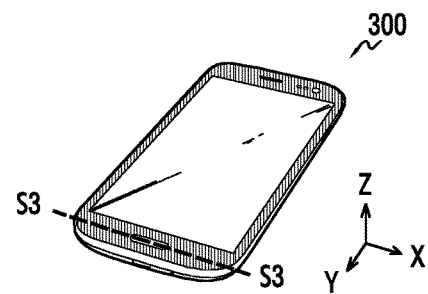
FIGS. 9A-9C are diagrams of an electronic device, a cross-sectional view, and a partial view of a coupling state among a display device, a spacer, a button plate, a circuit board, a case frame, and a cover, respectively, according to an embodiment of the present disclosure.
Figure 9B:
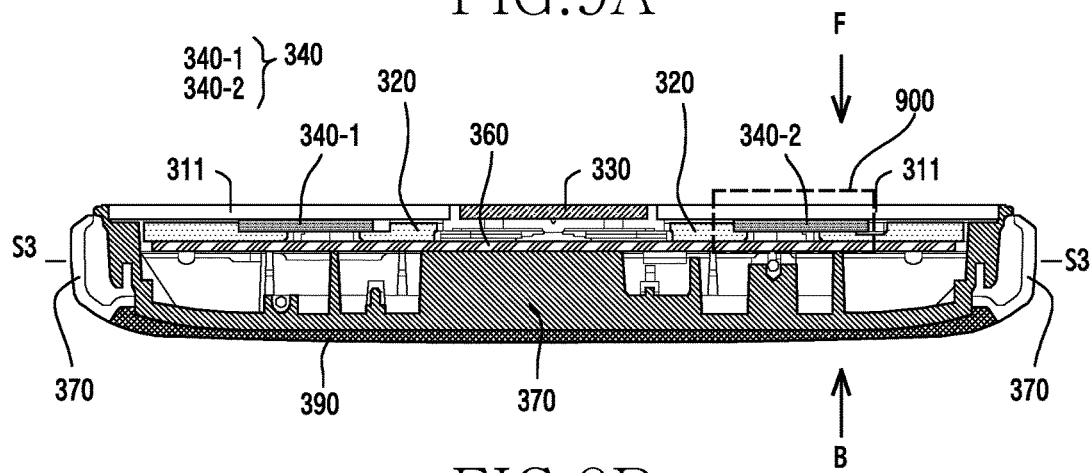
Figure 9C:
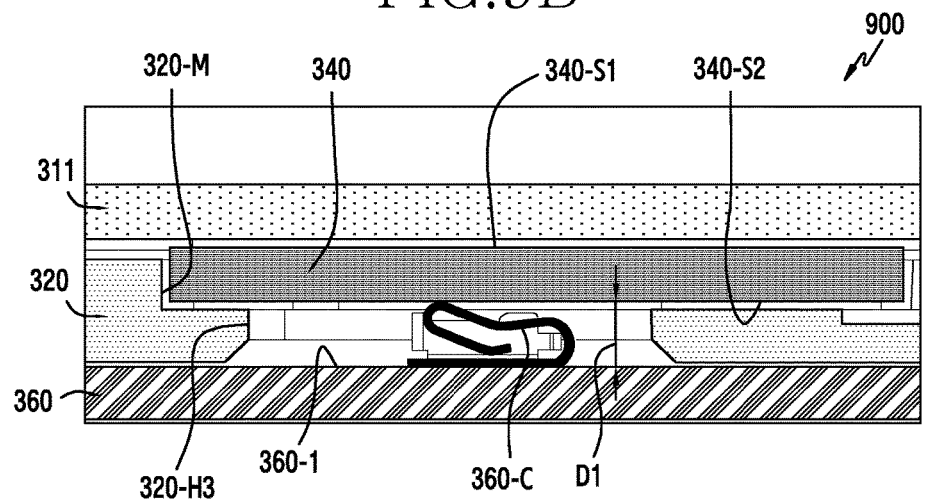

FIGS. 9A to 9C are a diagram of an electronic device, a cross-sectional view, and a partial view of a coupling state among a display device 310 (for example, a window 311), a spacer 320, a button plate 340, a circuit board 360, a case frame 370, and a cover 390, respectively, according to an embodiment of the present disclosure.

Referring to FIGS. 9A to 9C, according to an embodiment of the present disclosure, the spacer 320 is coupled to the circuit board 360, and the spacer 320 may be disposed on a $1^{st}$ side 360-1 of the circuit board 360. The button plate 340 may be coupled to a button plate installing groove 320-M of the spacer 320. The window 311 may be coupled to the case frame 370. The button plate 340 and the spacer 320 may be disposed between the window 311 and the circuit board 360.

According to an embodiment of the present disclosure, the button plate 340 may include a $1^{st}$ side 340-S1 directed to a front side F of the electronic device 300 and a $2^{nd}$ side 340-S2 directed to a back side B of the electronic device 300. The $2^{nd}$ side 340-S2 of the button plate 340 may be coupled to a circular-shaped side of the button plate installing groove 320-M by using a coupling means (e.g., double-sided tape, an adhesive, etc.). In addition, the $1^{st}$ side 340-S1 of the button plate 340 may be coupled to the window 311 by using the coupling means (e.g., double-sided tape, an adhesive, etc.).

According to an embodiment an embodiment of the present disclosure, a contact 360-C (e.g., a C-clip) installed in the $1^{st}$ side 360-1 of the circuit board 360 may be in contact with at least one part of a metallic side of the $2^{nd}$ side 340-S2 of the button plate 340 through a through-hole 320-H3 of the spacer 320. Since the contact 360-C has elasticity, an electrical connection between the contact 360-C and the button plate 340 may be maintained. A gap D1 between the button plate 340 and the circuit board 360 may correspond to a distance capable of elastically pressing the button plate 340 when the contact 360-C is elastically transformed.

According to an embodiment of the present disclosure, the gap D1 between the button plate 340 and the circuit board 360 may be maintained due to the spacer 320, and thus an electrical contact point may also be maintained between the button plate 340 and the contact 360-C. For example, if an impact is applied to a position on the window 311 corresponding to the contact 360-C, the contact point between the button plate 340 and the contact 360-C may be maintained, and thus malfunctions of an input circuit may be reduced. For example, even if the window 311 is floated, the contact point between the button plate 340 and the contact 360-C may be maintained, and thus malfunctions of the input circuit may be reduced.

Figure 10A:
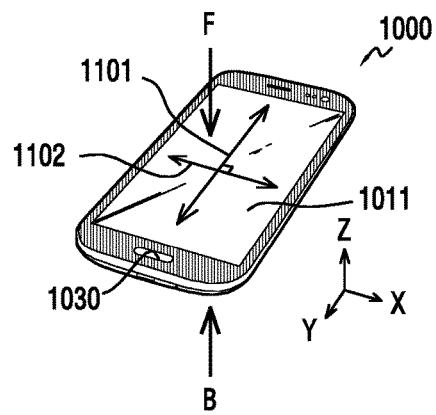
FIGS. 10A and 10B are diagrams of an electronic device and a portion of the electronic device, viewed in a direction from a front side to a back side, according to an embodiment of the present disclosure.
Figure 10B:
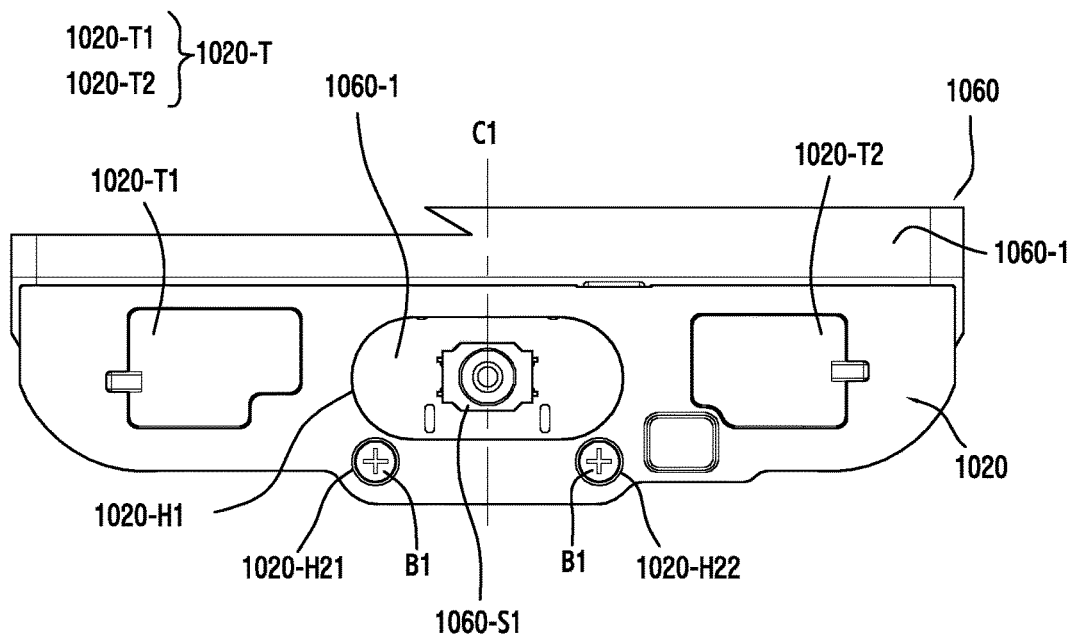
Figure 11:
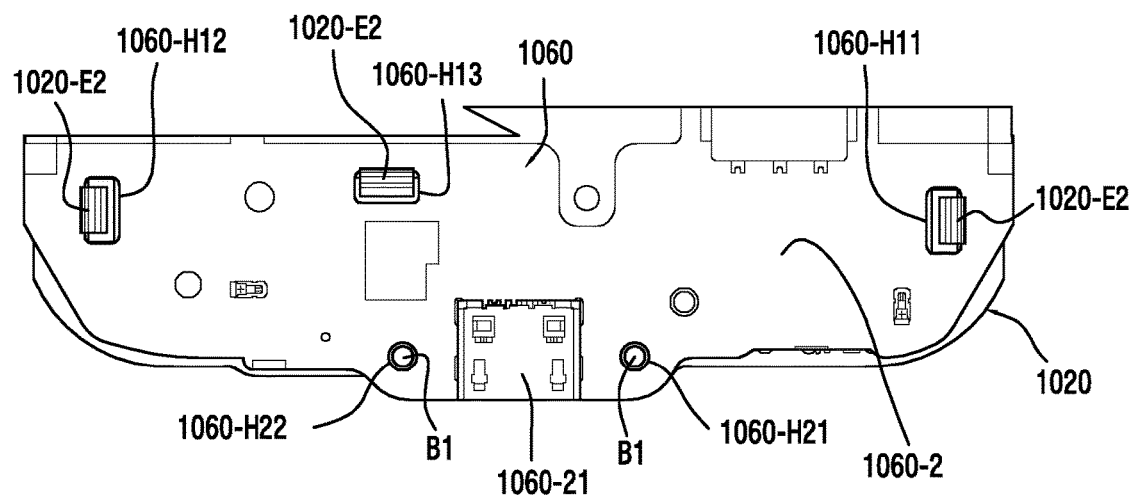
FIG. 11 is a diagram of a portion of an electronic device, viewed in a direction from a back side to a front side, according to an embodiment of the present disclosure.
Figure 12:
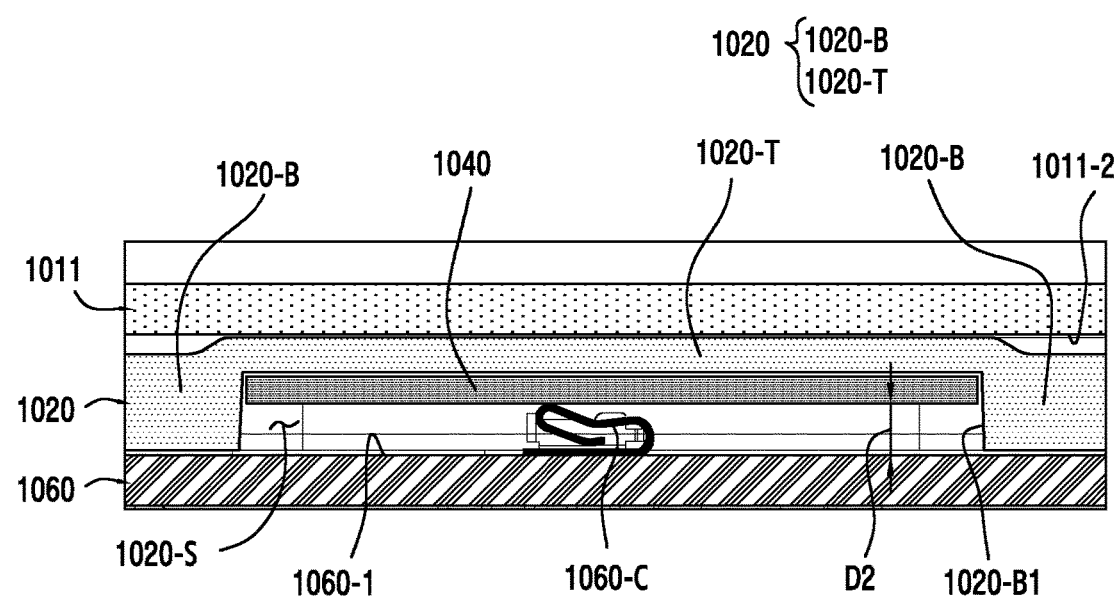
FIG. 12 is a cross-sectional view of an input device according to an embodiment of the present disclosure.

FIGS. 10A and 10B are a diagram of an electronic device 1000 and a portion of the electronic device 1000, viewed in a direction from a front side F to a back side B, according to an embodiment of the present disclosure. FIG. 11 is a diagram of a portion of the electronic device 1000, viewed in a direction from the back side B to the front side F, according to an embodiment of the present disclosure. In addition, FIG. 12 is a cross-sectional view of an input device according to an embodiment of the present disclosure.

Referring to FIG. 10A to FIG. 12, the electronic device 1000 may include a window 1011, a circuit board 1060, one pair of contacts 1060-C, a spacer 1020, and one pair of button plates 1040.

According to an embodiment of the present disclosure, the window 1011 may have an approximately plate-like shape, and may form the front side F of the electronic device 1000. The window 1011 may be the window 311 of the display device 310 of FIG. 3A.

According to an embodiment of the present disclosure, the circuit board 1060 may include a $1^{st}$ side 1060-1 and $2^{nd}$ side 1060-2 configured to be capable of mounting an electronic component. The $1^{st}$ side 1060-1 may be configured to be directed to the front side F of the electronic device 1000, and the $2^{nd}$ side 1060-2 may be configured to be directed to the back side B of the electronic device 1000.

According to an embodiment of the present disclosure, the circuit board 1060 may include a pressing switch 1060-S1 mounted to the $1^{st}$ side 1060-1. The pressing switch 1060-S1 may be located vertically below a button 1030. When the button 1030 moves vertically downward by pressing, the pressing switch 1060-S1 may be electrified between two contact points (not shown).

According to an embodiment of the present disclosure, the circuit board 1060 may include the pair of contacts 1060-C mounted to the $1^{st}$ side 1060-1 and supporting a touch or hovering input. Herein, the pressing switch 1060-S1 may be disposed between the pair of contacts 1060-C. The circuit board 1060 may include an input circuit electrically or operably connected to the pair of contacts 1060-C. The input circuit may determine whether a touch input occurs on the basis of a change in a capacitance. For example, if a change in capacitance is greater than or equal to a threshold, the input circuit may recognize that a touch input occurs. The change in capacitance may be triggered due to the proximity of a conductive material (e.g., a finger).

According to an embodiment of the present disclosure, the spacer 1020 may have a symmetrical shape about a center line C1 in a long-length direction 1101 of an approximately rectangular-shaped electronic device 1000.

According to an embodiment of the present disclosure, the spacer 1020 may support a $1^{st}$ through-hole 1020-H1 for supporting the pressing switch 1060-S1 installed in the $1^{st}$ side 1060-1 of the circuit board 1060. When the spacer 1020 is coupled to the circuit board 1060, the pressing switch 1060-S1 of the circuit board 1060 may be exposed through the $1^{st}$ through-hole 1020-H1 of the spacer 1020.

According to an embodiment of the present disclosure, the spacer 1020 may include one pair of $2^{nd}$ through-holes 1020-H21 and 1020-H22 for supporting bolt fastening. The pair of $2^{nd}$ through-holes 1020-H21 and 1020-H22 may be arranged in a short-length direction 1102 of the rectangular-shaped electronic device 1000. The circuit board 1060 may include one pair of through-holes 1060-H21 and 1060-H22 for supporting bolt fastening with respect to the spacer 1020. One pair of bolts B1 are coupled to the pair of $2^{nd}$ through-holes 1020-H21 and 1020-H22 of the spacer 1020 and the pair of through-holes 1060-H21 and 1060-H22 of the circuit board 1060, and the spacer 1020 and the circuit board 1060 may be coupled to each other.

According to an embodiment of the present disclosure, a connector 1060-21 installed in the $2^{nd}$ side 1060-2 of the circuit board 1060 may be disposed between the pair of through-holes 1060-H21 and 1060-H22 for supporting bolt fastening.

According to an embodiment of the present disclosure, the spacer 1020 may include a bottom portion 1020-B and one pair of top portions 1020-T extended from the bottom portion 1020-B. The bottom portion 1020-B may be disposed on the $1^{st}$ side 1060-1 of the circuit board 1060. The bottom portion 1020-B may include one pair of through-holes 1020-B1 directed from the back side B to the front side F of the electronic device 1000. The pair of top portions 1020-T may be extended from an upper side of the bottom portion 1020-B in proximity to the window 1011 to block an opening portion at an upper side of the pair of through-holes 1020-B1 in proximity to the window 1011. Due to the bottom portion 1020-B and the pair of top portions 1020-T, the spacer 1020 may have one pair of space portions 1020-S which are open in a direction from the front side F to the back side B of the electronic device 1000. The pair of space portions 1020-S may support a space between the pair of top portions 1020-T and the $1^{st}$ side 1060-T of the circuit board 1060.

According to an embodiment of the present disclosure, the $1^{st}$ through-hole 1020-H1 of the spacer 1020 may be disposed between the pair of top portions 1020-T of the spacer 1020.

According to an embodiment of the present disclosure, the pair of top portions 1020-T of the spacer 1020 may be in proximity to the window 1011. For example, the pair of top portions 1020-T of the spacer 1020 may be coupled to the window 1011 by using a coupling means (e.g., double-sided tape, etc.).

According to an embodiment of the present disclosure, the bottom portion 1020-B of the spacer 1020 may be separated from the window 1011. For example, the pair of top portions 1020-T of the spacer 1020 may relatively protrude from the bottom portion 1020-B in a direction from the back side B to the front side F of the electronic device 1000.

According to an embodiment of the present disclosure, the bottom portion 1020-B of the spacer 1020 may be in proximity to the window 1011. For example, the pair of top portions 1020-T of the spacer 1020 may form a flat surface in proximity to a flat surface 1011-2 of the window 1011 together with the bottom portion 1020-B, instead of relatively protruding from the bottom portion 1020-B in the direction from the back side B to the front side F of the electronic device 1000.

According to an embodiment of the present disclosure, the pair of button plates 1040 may be disposed respectively to the pair of space portions 1020-B1 of the spacer 1020. For example, the pair of button plates 1040 may be coupled to the pair of top portions 1020-T of the spacer 1020 by using a coupling means (e.g., double-sided tape, etc.).

According to an embodiment of the present disclosure, the pair of button plates 1040 are at least partially formed of a metallic material, and may be electrically or operably connected to the pair of contacts 1060-C of the circuit board 1060. The pair of contacts 1060-C of the circuit board 1060 are disposed in the pair of space portions 1020-B1 of the spacer 1020, and may be in contact with one metallic side of the pair of button plates 1040.

According to an embodiment of the present disclosure, since the pair of contacts 1060-C have elasticity, an electrical connection may be maintained between the pair of contacts 1060-C and the pair of button plates 1040. A gap D2 between the pair of button plates 1040 and the circuit board 1060 may correspond to a distance capable of elastically pressing the pair of button plates 1040 when the pair of contacts 1060-C is elastically transformed.

According to an embodiment of the present disclosure, the gap D2 between the pair of button plates 1040 and the circuit board 1060 may be maintained due to the spacer 1020, and thus an electrical contact point may also be maintained between the pair of button plates 1040 and the pair of contacts 1060-C. For example, even if an impact is applied on a position on the window 1011 corresponding to the pair of contacts 1060-C, the contact point between the pair of button plates 1040 and the pair of contacts 1060-C may be maintained, and thus malfunctions of an input circuit may be reduced. For example, even if the window 1011 is floated, the contact point between the pair of button plates 1040 and the pair of contacts 1060-C may be maintained, and thus malfunctions of the input circuit may be reduced.

According to an embodiment of the present disclosure, the top portion 1020-T of the spacer 1020 is at least partially formed of a metallic material to replace the pair of button plates 1040, and may be electrically or operably connected to the pair of contacts 1060-C of the circuit board 1060. Likewise, a gap between the circuit board 1060 and the pair of top portions 1020-t of the spacer 1020 may be maintained, and thus an electrical contact point may also be maintained between the pair of top portions 1020-T of the spacer 1020 and the pair of contacts 1060-C.

According to an embodiment of the present disclosure, the spacer 1020 may include a plurality of extension portions 1020-E2 for supporting snap-fit coupling with the circuit board 1060. The plurality of extension portions 1020-E2 may be extended in the direction from the front side F to the back side B of the electronic device 1000, and may include a free end having a hook shape.

According to an embodiment of the present disclosure, the circuit board 1060 may include a plurality of through-holes 1060-H11, 1060-H12, and 1060-H13 for supporting snap-fit coupling with the spacer 1020.

Figure 13A:
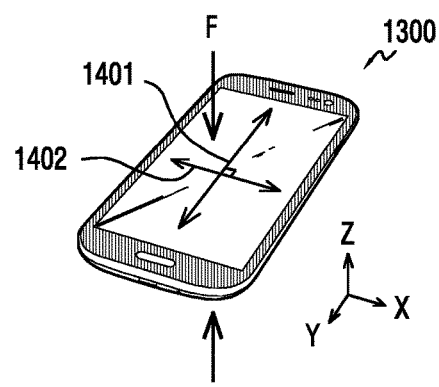
FIGS. 13A and 13B are diagrams of an electronic device and a portion of an electronic device, viewed in a direction from a front side to a back side, respectively, according to an embodiment of the present disclosure.
Figure 13B:
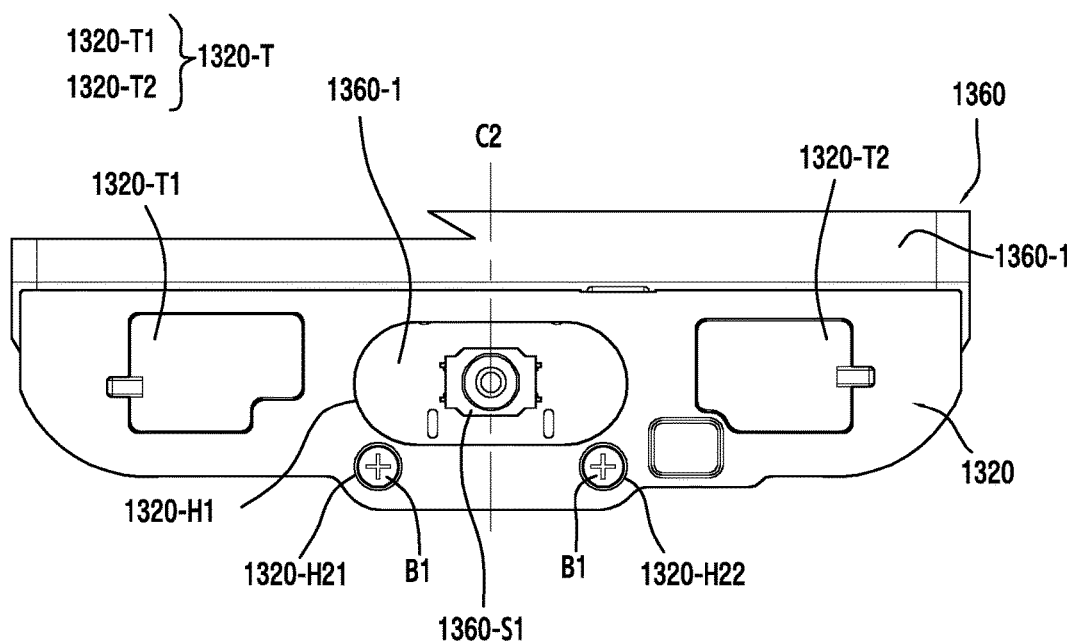
Figure 14:
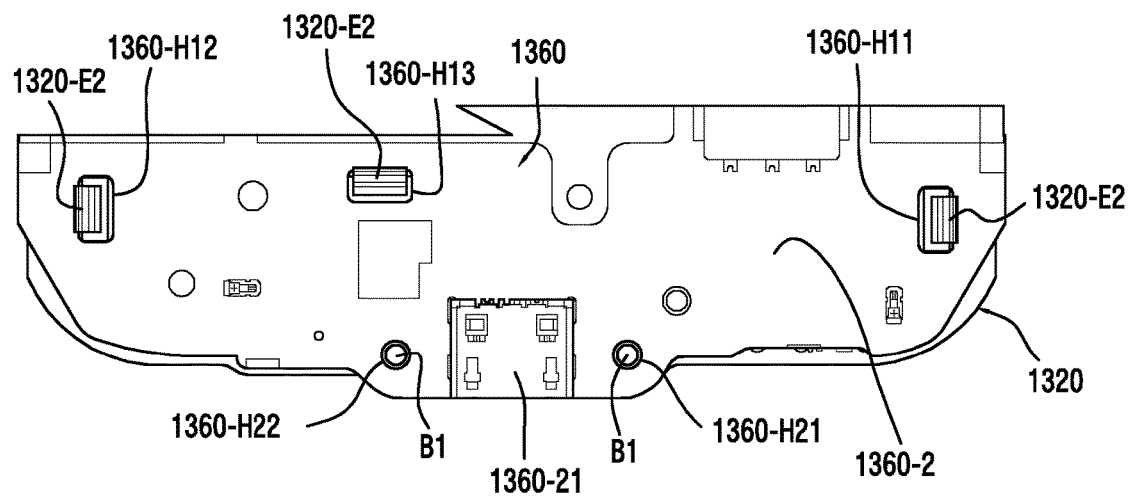
FIG. 14 is a diagram of a portion of an electronic device, viewed in a direction from a back side to a front side, according to an embodiment of the present disclosure.
Figure 15:
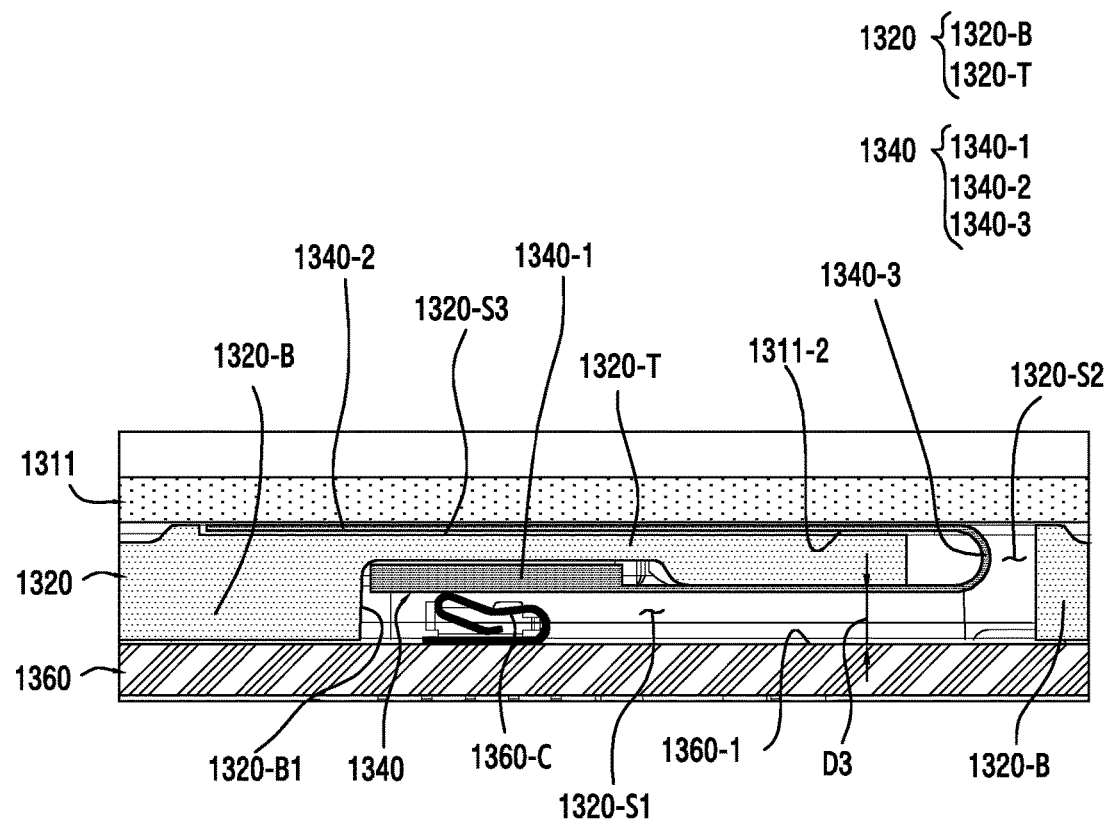
FIG. 15 is a cross-sectional view of an input device according to an embodiment of the present disclosure.
Figure 16A:
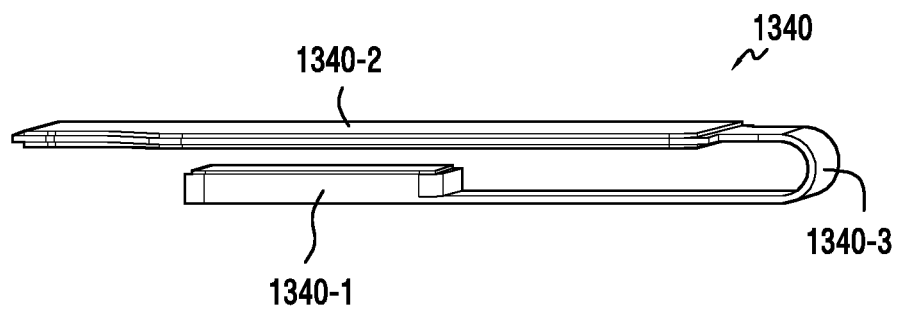
FIGS. 16A and 16B are diagrams of a button plate according to an embodiment of the present disclosure.
Figure 16B:
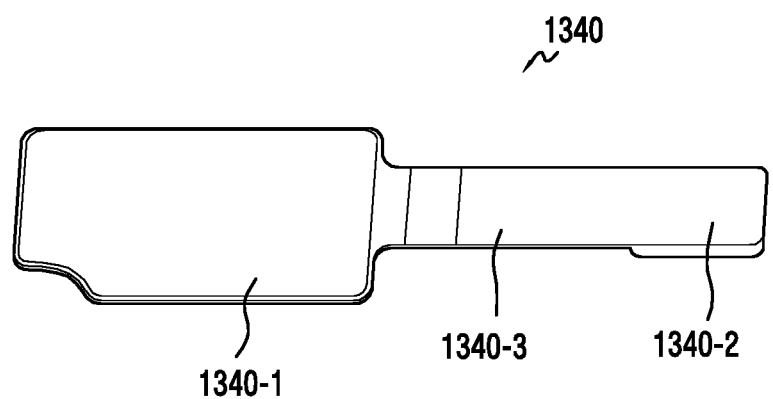

FIGS. 13A and 13B are a diagram of an electronic device 1300 and a portion of the electronic device 1300, viewed in a direction from a front side F to a back side B, according to an embodiment of the present disclosure. FIG. 14 is a diagram of a portion of an electronic device 1300, viewed in a direction from a back side B to a front side F, according to an embodiment of the present disclosure. FIG. 15 is a cross-sectional view of an input device according to an embodiment of the present disclosure. In addition, FIGS. 16A and 16B are diagrams of a button plate according to an embodiment of the present disclosure.

Referring to FIG. 13A to FIG. 16B, the electronic device 1300 may include a window 1311, a circuit board 1360, one pair of contacts 1360-C, a spacer 1320, and one pair of button plates 1340.

According to an embodiment of the present disclosure, the window 1311 may have an approximately plate-like shape, and may form the front side F of the electronic device 1300. The window 1311 may be the window 311 of the display device 310 of FIG. 3A.

According to an embodiment of the present disclosure, the circuit board 1360 may include a $1^{st}$ side 1360-1 and $2^{nd}$ side 1360-2 configured to be capable of mounting an electronic component. The $1^{st}$ side 1360-1 may be configured to be directed to the front side F of the electronic device 1300, and the $2^{nd}$ side 1360-2 may be configured to be directed to a back side B of the electronic device 1300.

According to an embodiment of the present disclosure, the circuit board 1360 may include a pressing switch 1360-S1 mounted to the $1^{st}$ side 1360-1. The pressing switch 1360-S1 may be located vertically below a button 1330. When the button 1330 moves vertically downward by pressing, the pressing switch 1360-S1 may be electrified between two contact points.

According to an embodiment an embodiment of the present disclosure, the circuit board 1360 may include the pair of contacts 1360-C mounted to the $1^{st}$ side 1360-1 and supporting a touch or hovering input. Herein, the pressing switch 1360-S1 may be disposed between the pair of contacts 1360-C. The circuit board 1360 may include an input circuit electrically or operably connected to the pair of contacts 1360-C. The input circuit may determine whether a touch input occurs on the basis of a change in a capacitance. For example, if a change in a capacitance is greater than or equal to a threshold, the input circuit may recognize that a touch input occurs. A change in a capacitance may be triggered due to a proximity of a conductive material (e.g., a finger).

According to an embodiment of the present disclosure, the spacer 1320 may have a symmetrical shape about a center line C2 in a long-length direction 1401 of an approximately rectangular-shaped electronic device 1300.

According to an embodiment of the present disclosure, the spacer 1320 may support a $1^{st}$ through-hole 1320-H1 for supporting the pressing switch 1360-S1 installed to the $1^{st}$ side 1360-1 of the circuit board 1360. When the spacer 1320 is coupled to the circuit board 1360, the pressing switch 1360-S1 of the circuit board 1360 may be exposed through the $1^{st}$ through-hole 1320-H1 of the spacer 1320.

According to an embodiment of the present disclosure, the spacer 1320 may include one pair of $2^{nd}$ through-holes 1320-H21 and 1320-H22 for supporting bolt fastening. The pair of $2^{nd}$ through-holes 1320-H21 and 1320-H22 may be arranged in a short-length direction 1402 of the rectangular-shaped electronic device 1300. The circuit board 1360 may include one pair of through-holes 1360-H21 and 1360-H22 for supporting bolt fastening with respect to the spacer 1320. One pair of bolts B1 are coupled to the pair of $2^{nd}$ through-holes 1320-H21 and 1320-H22 of the spacer 1320 and the pair of through-holes 1360-H21 and 1360-H22 of the circuit board 1360, and the spacer 1320 and the circuit board 1360 may be coupled to each other.

According to an embodiment of the present disclosure, a connector 1360-21 installed in the $2^{nd}$ side 1360-2 of the circuit board 1360 may be disposed between the pair of through-holes 1360-H21 and 1360-H22 for supporting bolt fastening.

According to an embodiment of the present disclosure, the spacer 1320 may include a bottom portion 1320-B and one pair of top portions 1320-T extended from the bottom portion 1320-B. The bottom portion 1320-B may be disposed on the $1^{st}$ side 1360-1 of the circuit board 1360. The bottom portion 1320-B may include one pair of through-holes 1320-B1 directed from the back side B to the front side F of the electronic device 1300. The pair of top portions 1320-T may be extended from an upper side of the bottom portion 1320-B in proximity to the window 1311 to block an opening portion at an upper side of the pair of through-holes 1320-B1 in proximity to the window 1311.

According to an embodiment of the present disclosure, if the spacer 1320 and the circuit board 1360 are coupled, a $1^{st}$ space 1320-S1 between the pair of top portions 1320-T of the spacer 1320 and the $1^{st}$ side 1360-1 of the circuit board 1360 and a $2^{nd}$ space (or through-hole) 1360-S2 for opening the $1^{st}$ space 1320-S1 in a direction from the back side B to the front side F of the electronic device 1300 may be formed. Herein, the $2^{nd}$ space 1320-S2 may be disposed between the $1^{st}$ space 1320-S1 and the window 1311.

According to an embodiment of the present disclosure, the $1^{st}$ through-hole 1320-H1 of the spacer 1020 may be disposed between the pair of top portions 1320-T of the spacer 1320.

According to an embodiment of the present disclosure, a $3^{rd}$ space 1320-S3 may be formed between the window 1311 and the pair of top portions 1320-T of the spacer 1320. For example, at least one side of the pair of top portions 1320-T of the spacer 1320 may be separated from the window 1311. Alternatively, the pair of top portions 1320-T of the spacer 1320 may include a groove for supporting the $3^{rd}$ space 1320-S3.

According to an embodiment of the present disclosure, if the window 1311, the spacer 1320, and the circuit board 1360 are coupled, the $3^{rd}$ space 1320-S3 may be configured to communicate with the $1^{st}$ space 1320-S1 through the $2^{nd}$ space 1320-S2.

According to an embodiment of the present disclosure, the bottom portion 1320-B of the spacer 1320 may be separated from the window 1311. For example, the pair of top portions 1320-T of the spacer 1320 may relatively protrude from the bottom portion 1320-B in the direction from the back side B to the front side F of the electronic device 1300.

According to an embodiment of the present disclosure, the bottom portion 1320-B of the spacer 1320 may be in proximity to the window 1311. For example, the pair of top portions 1320-T of the spacer 1320 may form a flat surface in proximity to a flat surface 1311-2 of the window 1311 together with the bottom portion 1320-B, instead of relatively protruding from the bottom portion 1320-B in a direction from the back side B to the front side F of the electronic device 1300.

According to an embodiment of the present disclosure, the pair of button plates 1340 may include a $1^{st}$ plate portion 1340-1, a $2^{nd}$ plate portion 1340-2, and a connection portion 1340-3 for providing an electrical connection between the $1^{st}$ plate portion 1340-1 and the $2^{nd}$ plate portion 1340-2.

According to an embodiment of the present disclosure, the $1^{st}$ plate portion 1340-1 of the pair of button plates 1340 is at least partially formed of a metallic material, and may be disposed to the $1^{st}$ space 1320-S1. For example, the $1^{st}$ plate portion 1340-1 may be coupled to the top portion 1320-T of the spacer 1320 by using a coupling means (e.g., double-sided tape). Herein, the top portion 1320-T of the spacer 1320 may be disposed between the window 1311 and the $1^{st}$ plate portion 1340-1.

According to an embodiment of the present disclosure, the $2^{nd}$ plate portion 1340-2 of the pair of button plates 1340 is at least partially formed of a metallic material, and may be disposed to the $3^{rd}$ space 1320-S3. For example, the $2^{nd}$ plate portion 1340-2 may be coupled to the top portion 1320-T of the spacer 1320 by using a coupling means (e.g., double-sided tape). Herein, the $2^{nd}$ plate portion 1340-2 may be disposed between the top portion 1320-T of the spacer 1320 and the window 1311.

According to an embodiment of the present disclosure, the connection portion 1340-3 of the pair of button plates 1340 may be extended from the $1^{st}$ plate portion 1340-1 to the $2^{nd}$ plate portion 1340-2 through the $2^{nd}$ space 1320-S2. The connection portion 1340-3 may be flexible.

According to an embodiment of the present disclosure, the pair of button plates 1340 may be configured in a shape of an FPCB.

According to an embodiment of the present disclosure, the $1^{st}$ plate portion 1340-1 of the pair of button plates 1340 may be electrically or operably connected to the pair of contacts 1360-C of the circuit board 1360. The pair of contacts 1360-C of the circuit board 1360 are disposed to the $1^{st}$ space 1320-S1, and may be in contact with one metallic side of the $1^{st}$ plate portion 1340-1 of the pair of button plates 1340.

According to an embodiment of the present disclosure, since the pair of contacts 1360-C have elasticity, an electrical connection may be maintained between the pair of contacts 1360-C and the pair of button plates 1340. A gap D3 between the $1^{st}$ plate portion 1340-1 of the pair of button plates 1340 and the circuit board 1360 may correspond to a distance capable of elastically pressing the $1^{st}$ plate portion 1340 of the pair of button plates 1340 when the pair of contacts 1360-C is elastically transformed.

According to an embodiment of the present disclosure, the gap D3 between the $1^{st}$ plate portion 1340-1 of the pair of button plates 1340 and the circuit board 1360 may be maintained due to the spacer 1320, and thus a contact point between the button plate 1340 and the pair of contacts 1360-C may also be maintained. For example, if an impact is applied on a position on the window 1311 corresponding to the pair of contacts 1360-C, the contact point between the $1^{st}$ plate portion 1340-1 of the pair of button plates 1340 and the pair of contacts 1360-C may be maintained, and thus malfunctions of an input circuit may be reduced. For example, if the window 1311 is floated, the contact point between the $1^{st}$ plate portion 1340-1 of the pair of button plates 1340 and the pair of contacts 1360-C may be maintained, and thus malfunctions of the input circuit may be reduced.

According to an embodiment of the present disclosure, the spacer 1320 may include a plurality of extension portions 1320-E2 for supporting snap-fit coupling with the circuit board 1360. The plurality of extension portions 1320-E2 may be extended in the direction from the front side F to the back side B of the electronic device 1300, and may include a free end having a hook shape.

According to an embodiment of the present disclosure, the circuit board 1360 may include a plurality of through-holes 1360-H11, 1360-H12, and 1360-H13 for supporting snap-fit coupling with the spacer 1320.

Figure 17:
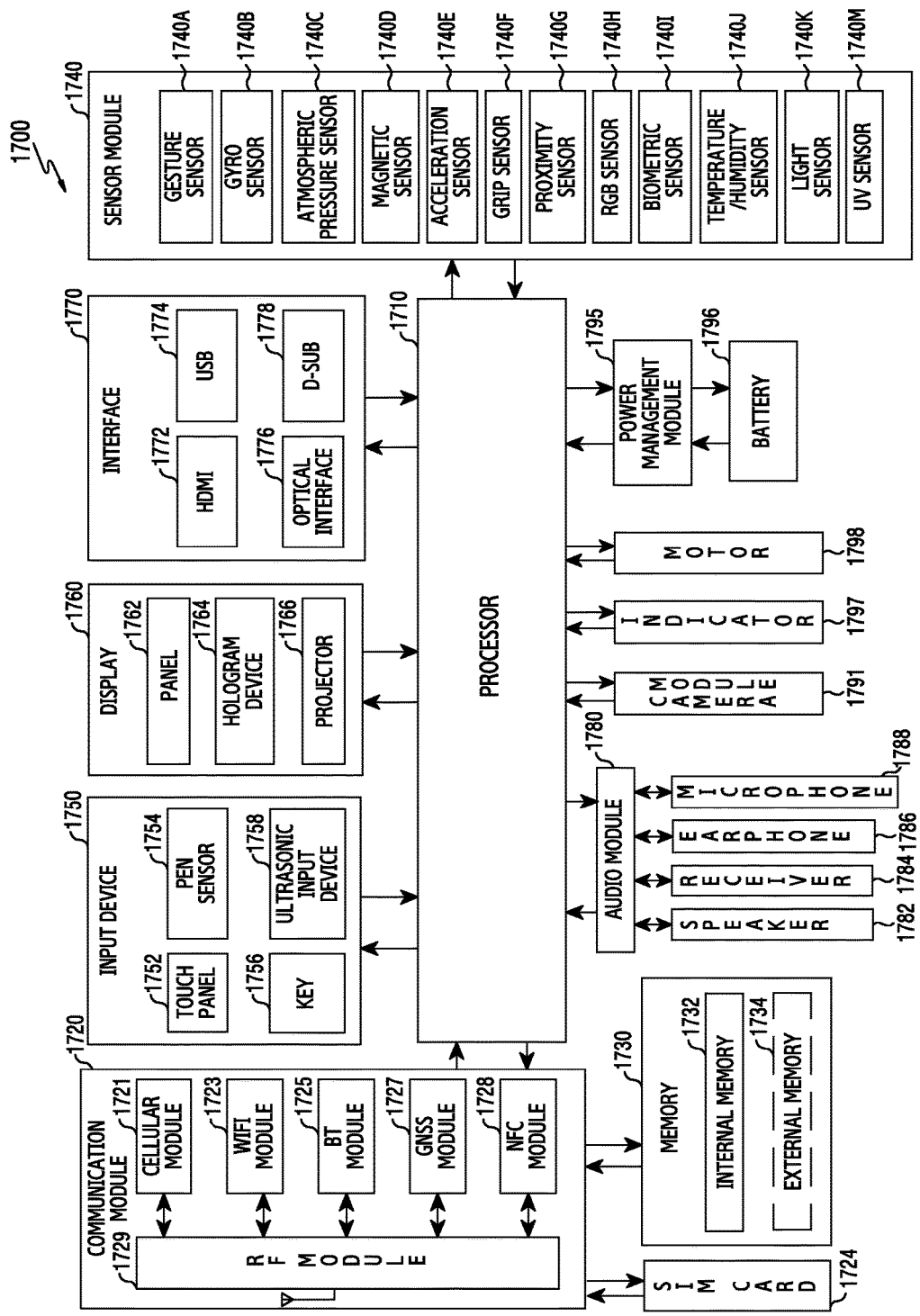
FIG. 17 is a block diagram of an electronic device according to an embodiment of the present disclosure.

FIG. 17 is a block diagram of an electronic device 1700 according to an embodiment of the present disclosure.

Referring to FIG. 17, the electronic device 1700 may include, for example, all or some parts of the electronic device 300 of FIG. 3A. The electronic device 1700 may include one or more processors (e.g., APs) 1710, a communication module 1720, a subscriber identification module (SIM) card 1724, a memory 1730, a sensor module 1740, an input unit 1750, a display 1760, an interface 1770, an audio module 1780, a camera module 1791, a power management module 1795, a battery 1796, an indicator 1797, and a motor 1798.

The processor 1710 may control a plurality of hardware or software elements connected to the processor 1710 by driving, for example, an operating system or an application program, may process a variety of data including multimedia data, and may perform an arithmetic operation. The processor 1710 may be implemented, for example, with a system on chip (SoC). According to an embodiment of the present disclosure, the processor 1710 may further include a graphics processing unit (GPU) and/or an image signal processor.

The communication module 1720 may include, for example, a cellular module 1721, a wireless fidelity (WiFi) module 1723, a Bluetooth (BT) module 1725, a global navigation satellite system (GNSS) module 1727, a near field communication (NFC) module 1728, and a radio frequency (RF) module 1729.

The cellular module 1721 may provide voice call, video call, text service, Internet service, or the like, for example, through a communication network. According to an embodiment an embodiment of the present disclosure, the cellular module 1721 may identify and authenticate the electronic device 1700 in the communication network by using the SIM card 1724. The cellular module 1721 may perform at least some functions that may be provided by the processor 1710. The cellular module 1721 may include a communication processor (CP).

Each of the WiFi module 1723, the BT module 1725, the GNSS module 1727, and the NFC module 1728 may include, for example, a processor for processing data transmitted/received through a corresponding module. According to an embodiment of the present disclosure, at least some (e.g., two or more) of the cellular module 1721, the WiFi module 1723, the BT module 1725, the GNSS module 1727, and the NFC module 1728 may be included in one integrated circuit (IC) or IC package.

The RF module 1729 may transmit/receive, for example, a communication signal (e.g., an RF signal). The RF module 1729 may include, for example, a transceiver, a power amplifier module (PAM), a frequency filter, a low noise amplifier (LNA), an antenna, or the like. According to an embodiment of the present disclosure, at least one of the cellular module 1721, the WiFi module 1723, the BT module 1725, the GNSS module 1727, and the NFC module 1728 may transmit/receive an RF signal via a separate RF module.

The SIM card 1724 may include, for example, an embedded SIM, and may include unique identification information (e.g., an integrated circuit card identifier (ICCID)) or subscriber information (e.g., an international mobile subscriber identity (IMSI)).

The memory 1730 may include, for example, an internal memory 1732 or an external memory 1734. The internal memory 1732 may include, for example, at least one of a volatile memory (e.g., a dynamic random access memory (DRAM), a static RAM (SRAM), a synchronous dynamic RAM (SDRAM), etc.) and a non-volatile memory (e.g., a one time programmable read only memory (OTPROM), a programmable ROM (PROM), an erasable and programmable ROM (EPROM), an electrically erasable PROM (EEPROM), a mask ROM, a flash ROM, a flash memory (e.g., a NAND flash memory, a NOR flash memory, etc.), a hard drive, or a solid state drive (SSD)).

The external memory 1734 may further include a flash drive, for example, compact flash (CF) drive, a secure digital (SD) drive, micro secure digital (Micro-SD) drive, mini secure digital (Mini-SD) drive, extreme digital (xD) drive, a memory stick, or the like. The external memory 1734 may be operatively and/or physically coupled to the electronic device 1700 via various interfaces.

The sensor module 1740 may measure, for example, a physical quantity or detect an operational status of the electronic device 1700, and may convert the measured or detected information into an electrical signal. The sensor module 1740 may include, for example, at least one of a gesture sensor 1740A, a gyro sensor 1740B, an atmospheric pressure sensor 1740C, a magnetic sensor 1740D, an acceleration sensor 1740E, a grip sensor 1740F, a proximity sensor 1740G, a color sensor 1740H (e.g., a red, green, blue (RGB) sensor), a biometric sensor 1740I, a temperature/humidity sensor 1740J, a light sensor 1740K, and an ultra violet (UV) light sensor 1740M. Additionally or alternatively, the sensor module 1740 may include, for example, an electronic nose (E-nose) sensor, an electromyography (EMG) sensor, an electroencephalogram (EEG) sensor, an electrocardiogram (ECG) sensor, an infrared (IR) sensor, an iris sensor, and/or a fingerprint sensor. The sensor module 1740 may further include a control circuit for controlling at least one or more sensors included therein. In an embodiment of the present disclosure, the electronic device 1700 may further include a processor configured to control the sensor module 1704 either separately or as a part of the processor 1710, and may control the sensor module 1740 while the processor 1710 is in a reduced power (e.g. sleep) state.

The input device 1750 may include, for example, a touch panel 1752, a (digital) pen sensor 1754, a key 1756, or an ultrasonic input unit 1758. The touch panel 1752 may recognize a touch input, for example, by using at least one of an electrostatic type panel, a pressure-sensitive type panel, and an ultrasonic type panel. The touch panel 1752 may further include a control circuit. The touch penal 1752 may further include a tactile layer and thus may provide the user with a tactile reaction.

According to an embodiment of the present disclosure, the input device 1750 may be implemented with at least one configuration of FIG. 5 to FIG. 16. For example, the input device 1750 may include a housing including a window, which forms a $1^{st}$ side of the electronic device 1700, and a $2^{nd}$ side directed in an opposite direction of the $1^{st}$ side, a circuit board disposed between the $1^{st}$ side and the $2^{nd}$ side and including an input circuit configured to detect an input on the basis of a change in a capacitance, a spacer disposed between the window and the circuit board and having at least one space formed on one side facing the circuit board, a contact electrically or operably connected to the input circuit by being mounted to one side of the circuit board and contained in the at least one space, and a conductive plate coupled to the space in such a manner to be in proximity to the window and being separated from the circuit board and electrically or operably connected to the contact through the space.

The (digital) pen sensor 1754 may be implemented, for example, by using the same or a similar method of receiving a touch input of the user or by using an additional sheet for recognition. The key 1756 may be, for example, a physical button, an optical key, a keypad, or a touch key. The ultrasonic input unit 1758 is a device by which the electronic device 1700 detects a sound wave through a microphone (e.g., a microphone 1788) by using a pen which generates an ultrasonic signal.

The display 1760 (e.g., the display 160 of FIG. 1) may include a panel 1762, a hologram 1764, or a projector 1766. The panel 1762 may include the same or a similar structure of the display 160 of FIG. 1. The panel 1762 may be implemented, for example, in a flexible, transparent, or wearable manner. The panel 1762 may be constructed as one module with the touch panel 1752. The hologram 1764 may use the interference of light to provide a stereoscopic image in the air. The projector 1766 may display an image by projecting a light beam onto a screen. The screen may be located, for example, internal or external to the electronic device 1700. According to an embodiment of the present disclosure, the display 1760 may further include a control circuit for controlling the panel 1762, the hologram 1764, or the projector 1766.

The interface 1770 may include, for example, a high-definition multimedia interface (HDMI) 1772, a USB 1774, an optical interface 1776, or a D-subminiature (D-sub) connector 1778. Additionally or alternatively, the interface 1770 may include, for example, a mobile high-definition link (MHL), an SD/multimedia card (MMC), or an Infrared Data Association (IrDA) standard.

The audio module 1780 may bilaterally convert, for example, a sound and an electric signal. The audio module 1780 may convert sound information which is input or output, for example, through a speaker 1782, a receiver 1784, an earphone 1786, a microphone 1788, or the like.

The camera module 1791 is, for example, a device for image and video capturing, and according to an embodiment an embodiment of the present disclosure, may include one or more image sensors (e.g., a front sensor or a rear sensor), a lens, an image signal processor (ISP), or a flash (e.g., an LED or a xenon lamp).

The power management module 1795 may manage, for example, power of the electronic device 1700. According to an embodiment an embodiment of the present disclosure, the power management module 1795 may include a power management integrated circuit (PMIC), a charger IC, or a battery gauge. The PMIC may have a wired and/or wireless charging type. The wireless charging type may include, for example, magnetic resonance type wireless charging, magnetic induction type wireless charging, electromagnetic type wireless charging, or the like, and may further include an additional circuit for wireless charging, for example, a coil loop, a resonant circuit, a rectifier, or the like. The battery gauge may measure, for example, a residual quantity of the battery 1796 and a voltage, a current, and a temperature during charging. The battery 1796 may include, for example, a rechargeable battery and/or a solar battery.

The indicator 1797 may display a certain state, for example, a booting state, a message state, a charging state, or the like, of the electronic device 1700 or a part thereof. The motor 1798 may convert an electric signal into a mechanical vibration, and may generate a vibration or haptic effect. The electronic device 1700 may include a processing unit (e.g., a GPU) for supporting mobile TV. The processing unit for supporting mobile TV may process media data according to a protocol of, for example, digital multimedia broadcasting (DMB), digital video broadcasting (DVB), media flow, or the like.

Each element described in the present disclosure may include one or more components, and the names thereof may vary depending on the type of the electronic device. The electronic device according to an embodiment of the present disclosure may include at least one of the elements described in the present disclosure. However, some of the elements may be omitted, or additional elements may be further included. Further, some of the elements of the electronic device according to various embodiments may be combined and constructed as one entity, so as to equally perform functions of corresponding elements before combination.

Figure 18:
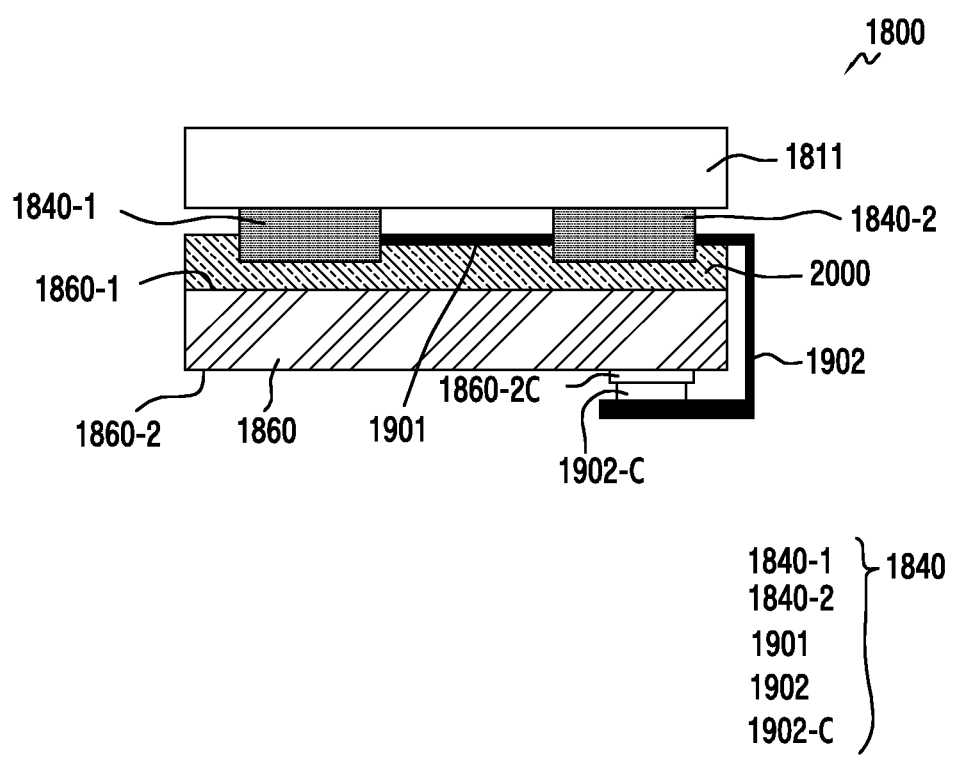
FIG. 18 is a diagram of a conventional input device.

FIG. 18 is a diagram of a conventional input device 1800.

Referring to FIG. 18, the conventional input device 1800 may include a window 1811, a touch key FPCB 1840, a bracket 2000, and a circuit board 1860.

The bracket 2000 may be disposed between the window 1811 and the circuit board 1860. The circuit board 1860 may include a $1^{st}$ side 1860-1 directed to the window 1811 and a $2^{nd}$ side 1860-2 disposed to an opposite side of the $1^{st}$ side 1860-1. The bracket 2000 may be coupled to the $1^{st}$ side 1860-1 of the circuit board 1860. In particular, the bracket 2000 may have a size largely overlapping with the window 1811.

The touch key FPCB 1840 may include a $1^{st}$ portion disposed between the window 1811 and the bracket 2000 and a $2^{nd}$ portion electrically extended from the $1^{st}$ portion and connected to the $2^{nd}$ side 1860-2 of the circuit board 1860. The $1^{st}$ portion may include a $1^{st}$ connection portion 1901 for providing an electrical connection between a $1^{st}$ touch key 1840-1, and a $2^{nd}$ touch key 1840-2. Herein, the bracket 2000 may play a role in supporting the $1^{st}$ portion of the touch key FPCB 1840. One end of the $2^{nd}$ portion of the touch key FPCB 1840 is connected to the $1^{st}$ portion of the touch key FPCB 1840 by the $2^{nd}$ connection portion 1902, and the other end of the $2^{nd}$ portion of the touch key FPCB 1840 may include a connector 1902-C electrically coupled to a connector 1860-2C mounted to the $2^{nd}$ side 1860-2 of the circuit board 1860.

The conventional input device 1800 additionally includes the bracket 2000 for supporting the touch key FPCB 1840. In contrast, since the touch key FPCB 1840 is not constructed in an embodiment of the present disclosure, material reduction and structural simplification may be achieved by an embodiment of the present disclosure in comparison to the conventional input device 1800.

The touch key FPCB 1840 of the conventional input device 1800 includes a plurality of components (e.g., the $1^{st}$ touch key 1840-1, the $2^{nd}$ touch key 1840-2, the $1^{st}$ connection portion 1901, the $2^{nd}$ connection portion 1902, the connector 1902-C, etc.) as described above. In contrast, an embodiment of the present disclosure may lead to cost reduction by simplifying a key structure.

The touch key FPCB 1840 of the conventional input device 1800 has an approximately electrical line shape having a long length, and thus malfunctions may occur due to the influence of external noise. In contrast, an embodiment of the present disclosure may reduce the influence of external noise by simplifying the key structure.

The touch key FPCB 1840 of the conventional input device 1800 has an approximately electrical line shape having a long length, and thus antenna performance of an antenna device equipped in the electronic device may deteriorate due to the touch key FPCB 1840. In contrast, an embodiment of the present disclosure may reduce deterioration of antenna performance of the antenna device by simplifying the key structure.

The touch key FPCB 1840 of the conventional input device 1800 may be easily damaged, such as by a tear in a component during an assembly process of the electronic device. In contrast, an embodiment of the present disclosure may facilitate assembly and reduce damage during the assembly process by simplifying the key structure.

An embodiment of the present disclosure has a simple structure and which is easily assembled in comparison to the conventional input device, thus the present disclosure is easily applied to other electronic devices.

According to an embodiment of the present disclosure, an electronic device may include a housing including a window, configured to form a $1^{st}$ side of the electronic device, and a $2^{nd}$ side of the electronic device directed in an opposite direction of the $1^{st}$ side of the electronic device, a circuit board between the $1^{st}$ side and the $2^{nd}$ side of the electronic device, and comprising an input circuit configured to detect an input based on a change in a capacitance, a spacer between the window and the circuit board, and having at least one space formed on one side facing the circuit board, a contact electrically connected to the input circuit by being mounted to one side of the circuit board, and contained in the at least one space, and a conductive plate coupled to the spacer, and electrically connected to the contact through the at least one space.

According to an embodiment of the present disclosure, a contact may be configured to be in contact with a conductive plate in an elastically transformed state.

According to an embodiment of the present disclosure, a contact may include a C-clip.

According to an embodiment of the present disclosure, a space may include a through-hole through which a contact may be inserted, and a conductive plate may be disposed between the through-hole and the contact.

According to an embodiment of the present disclosure, a spacer may include a circular-shaped groove formed around a through-hole, and a conductive plate may be coupled to the groove.

According to an embodiment of the present disclosure, a spacer may include an extension portion disposed to at least one portion between a window and a space.

According to an embodiment of the present disclosure, a conductive plate may be disposed inside a space, and may be coupled to an extension portion.

According to an an embodiment of the present disclosure, an electronic device may include an additional conductive plate extended from a conductive plate to a portion between a window and an extension portion.

According to an embodiment of the present disclosure, a spacer may further include a through-hole formed in an extension portion, and a connection portion for providing an electrical connection between conductive plates through the through-hole.

According to an embodiment of the present disclosure, a conductive plate may include an FPCB.

According to an embodiment of the present disclosure, a spacer may include a plurality of hook-shaped extension portions extended in a direction from a $1^{st}$ side to a $2^{nd}$ side, and a circuit board may include a plurality of through-holes that may be fastened with the plurality of extension portions.

According to an embodiment of the present disclosure, a spacer and a circuit board may be coupled with a housing by using a bolt fastener.

According to an embodiment of the present disclosure, an electronic device may further include a connector mounted to an opposite side of one side of a circuit board. The circuit board may include one pair of through-holes for bolt fastening. In addition, the connector may be disposed between the pair of through-holes.

According to an embodiment of the present disclosure, an electronic device may further include a $1^{st}$ through-hole formed in a window, a $2^{nd}$ through-hole formed in a spacer, a button inserted in the $1^{st}$ through-hole and the $2^{nd}$ through-hole, where the button is capable of being pressed in a direction from a $1^{st}$ side to a $2^{nd}$ side, and a pressing switch mounted to one side of the circuit board and electrified by pressing the button.

According to an embodiment of the present disclosure, a contact may be disposed to each side of a pressing switch.

According to an embodiment of the present disclosure, an electronic device may further include a display disposed between a window and a circuit board and exposed through the window. The display may be disposed not to overlap with a spacer.

According to an embodiment of the present disclosure, an area of a window not overlapping with a display may be formed opaquely.

According to an embodiment of the present disclosure, an electronic device may further include an additional spacer disposed between a window and a circuit board. A display may be disposed between the spacers.

According to an embodiment of the present disclosure, an electronic device may further include a through-hole formed in a window, and a speaker placed to an additional spacer and outputting a sound through the through-hole.

According to an embodiment of the present disclosure, an electronic device may include a housing including a window, configured to form a $1^{st}$ side of the electronic device comprising a $1^{st}$ through-hole, and a $2^{nd}$ side of the electronic device directed in an opposite direction of the $1^{st}$ side of the electronic device, a circuit board between the $1^{st}$ side and the $2^{nd}$ side of the electronic device, and comprising an input circuit configured to detect an input based on a change in a capacitance, a spacer between the window and the circuit board comprising a $2^{nd}$ through-hole and at least one $3^{rd}$ through-hole placed around the $2^{nd}$ through hole, a button inserted in the $1^{st}$ through-hole and the $2^{nd}$ through-hole, wherein the button is capable of being pressed in a direction from the $1^{st}$ side of the electronic device to the $2^{nd}$ side of the electronic device, a pressing switch mounted to one side of the circuit board, between a pair of contacts, and electrified by pressing the button, a pair of conductive plates between the at least one $3^{rd}$ through-hole and the window and coupled to the spacer under the window and be separated from the circuit board, and the pair of contacts configured electrically connected to the pair of conductive plates, respectively, in an elastically transformed state through the at least one the $3^{rd}$ through-hole.

While the present disclosure has been shown and described with reference to certain embodiments thereof, it will be understood by those skilled in the art that various modifications in form and detail may be made therein without departing from the scope and spirit of the disclosure. Accordingly, all such modifications are intended to be includes within the scope of the present disclosure as defined by the appended claims and their equivalents.

What is claimed is:

1. An electronic device, comprising:
   a housing including a window, configured to form a 1st side of the electronic device, and a 2nd side of the electronic device directed in an opposite direction of the 1st side of the electronic device;
   a circuit board between the 1st side and the 2nd side of the electronic device, and comprising an input circuit configured to detect an input based on a change in a capacitance;
   a spacer between the window and the circuit board, and having at least one space formed on one side facing the circuit board;
   a display between the window and the circuit board, wherein the display is disposed to not overlap with the spacer;
   a contact electrically connected to the input circuit by being mounted to one side of the circuit board, and contained in the at least one space; and
   a conductive plate coupled to the spacer, and electrically connected to the contact through the at least one space, wherein the conductive plate is disposed in proximity to a rear surface of the window.

2. The electronic device of claim 1, wherein the contact includes a flexible conductive member.

3. The electronic device of claim 1, wherein the contact comprises a C-clip.

4. The electronic device of claim 1,
   wherein the spacer comprises a plurality of hook-shaped extension portions extended in a direction from the 1st side of the electronic device to the 2nd side of the electronic device, and
   wherein the circuit board comprises a plurality of through-holes that are fastened to the plurality of extension portions.

5. The electronic device of claim 1,
   wherein the at least one space comprises a through-hole through which the contact is inserted, and
   wherein the conductive plate is disposed between the through-hole and the contact.

6. The apparatus of claim 5,
   wherein the spacer comprises a circular-shaped groove formed around the through-hole, and
   wherein the conductive plate is coupled to the circular-shaped groove.

7. The electronic device of claim 1, wherein the spacer comprises an extension portion disposed between the window and the at least one space.

8. The electronic device of claim 7, wherein the conductive plate is disposed inside the at least one space, and is coupled to the extension portion.

9. The electronic device of claim 8, further comprising an additional conductive plate extended from the conductive plate to a portion between the window and the extension portion, and coupled to the extension portion.

10. The electronic device of claim 8, wherein the spacer further comprises:
    a through-hole formed in the extension portion; and
    a connection portion for providing an electrical connection between the conductive plates through the through-hole.

11. The electronic device of claim 10, wherein the conductive plate comprises a flexible printed circuit board (FPCB).

12. The electronic device of claim 1, wherein the spacer and the circuit board are coupled with the housing using a bolt fastener.

13. The electronic device of claim 12, further comprising a connector mounted to an opposite side of one side of the circuit board,
    wherein the circuit board comprises one pair of through-holes for the bolt fastener, and
    wherein the connector is disposed between the pair of through-holes.

14. The electronic device of claim 1, further comprising:
    a 1st through-hole formed in the window;
    a 2nd through-hole formed in the spacer;
    a button inserted into the 1st through-hole and the 2nd through-hole, where the button is capable of being pressed in a direction from the 1st side of the electronic device to the 2nd side of the electronic device; and
    a pressing switch mounted to one side of the circuit board and electrified by pressing the button.

15. The electronic device of claim 14, wherein the contact is disposed to at least one side of the pressing switch.

16. The electronic device of claim 1, wherein an area of the window not overlapping with the display is opaque.

17. The electronic device of claim 1, further comprising an additional spacer disposed between the window and the circuit board, wherein the display is disposed between the spacer and the additional spacer.

18. The electronic device of claim 17, further comprising:
    a through-hole formed in the window; and
    a speaker placed in the additional spacer and outputting sound through the through-hole.

19. An electronic device, comprising:
    a housing including a window, configured to form a 1st side of the electronic device comprising a 1st through-hole, and a 2nd side of the electronic device directed in an opposite direction of the 1st side of the electronic device;

a circuit board between the 1st side and the 2nd side of the electronic device, and comprising an input circuit configured to detect an input based on a change in a capacitance;

a spacer between the window and the circuit board comprising a 2nd through-hole and at least one 3rd through-hole placed around the 2nd through hole;

a button inserted in the 1st through-hole and the 2nd through-hole, wherein the button is capable of being pressed in a direction from the 1st side of the electronic device to the 2nd side of the electronic device;

a pressing switch mounted to one side of the circuit board, between a pair of contacts, and electrified by pressing the button;

a pair of conductive plates between the at least one 3rd through-hole and the window and coupled to the spacer under the window and separated from the circuit board; and the pair of contacts electrically connected to the pair of conductive plates, respectively, in an elastically transformed state through the at least one 3rd through-hole.

* * * * *